United States Patent
Osada et al.

(10) Patent No.: US 7,672,502 B2
(45) Date of Patent: Mar. 2, 2010

(54) SUBSTRATE POSITIONING DEVICE, SUBSTRATE POSITIONING METHOD AND PROGRAM

(75) Inventors: Keiji Osada, Nirasaki (JP); Yasuhiko Nishinakayama, Nirasaki (JP); Gaku Ikeda, Nirasaki (JP); Hiroyuki Takahashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1016 days.

(21) Appl. No.: 11/384,299

(22) Filed: Mar. 21, 2006

(65) Prior Publication Data

US 2006/0222236 A1 Oct. 5, 2006

Related U.S. Application Data

(60) Provisional application No. 60/666,708, filed on Mar. 31, 2005.

(30) Foreign Application Priority Data

Mar. 30, 2005 (JP) ............................. 2005-097006

(51) Int. Cl.
*G06K 9/00* (2006.01)
(52) U.S. Cl. ....................... 382/151; 382/141; 382/145; 702/150; 702/151
(58) Field of Classification Search .......... 382/141–153
See application file for complete search history.

(56) References Cited

U.S. PATENT DOCUMENTS

| | | | | |
|---|---|---|---|---|
| 5,438,209 A | * | 8/1995 | Yamamoto et al. | 250/559.29 |
| 5,648,854 A | * | 7/1997 | McCoy et al. | 356/399 |
| 5,974,169 A | * | 10/1999 | Bachelder | 382/151 |
| 6,162,008 A | * | 12/2000 | Perkins et al. | 414/754 |
| 6,400,445 B2 | * | 6/2002 | Nishi et al. | 355/72 |
| 6,836,690 B1 | * | 12/2004 | Spady et al. | 700/108 |
| 7,109,511 B2 | * | 9/2006 | Inenaga et al. | 250/559.36 |

FOREIGN PATENT DOCUMENTS

| | | |
|---|---|---|
| JP | 06-085038 | 3/1994 |
| JP | 10-163301 | 6/1998 |

* cited by examiner

*Primary Examiner*—Bhavesh M Mehta
*Assistant Examiner*—Eric Rush
(74) *Attorney, Agent, or Firm*—Oblon, Spivak, McClelland, Maier & Neustadt, L.L.P.

(57) ABSTRACT

Noise reduction processing for detecting the circumferential edge of a wafer W placed on a rotary stage with a light-transmitting sensor, obtaining detection values provided by the light-transmitting sensor as substrate edge shape data, detecting sudden abnormal data in the substrate edge shape data, eliminating the detected sudden abnormal data and interpolating the substrate edge shape data with estimated data generated based upon surrounding data in place of the abnormal data, notch mark judgment processing for detecting a notch mark candidate in the substrate edge shape data having undergone the noise reduction processing and making a decision as to whether or not the sets of data corresponding to the notch mark candidate area satisfies a predetermined judgment condition, and substrate positioning processing for positioning the substrate based upon a notch mark that satisfies the predetermined judgment conditions are executed.

10 Claims, 20 Drawing Sheets

SUBSTRATE POSITIONING DEVICE, SUBSTRATE POSITIONING METHOD AND PROGRAM

CROSS REFERENCE TO RELATED APPLICATIONS

This document claims priority to Japanese Patent Application No. 2005-097006, filed Mar. 30, 2005 and U.S. Provisional Application No. 60/666,708, filed Mar. 31, 2005, the entire contents of which are hereby incorporated by reference.

FIELD OF THE INVENTION

The present invention relates to a substrate positioning device, a substrate positioning method and a program, to be adopted to position a substrate such as a wafer based upon a notch mark detected at a peripheral edge of the substrate.

BACKGROUND OF THE INVENTION

In a substrate processing apparatus, a substrate undergoing processing for semiconductor device production, such as a wafer, is carried into a processing chamber via a transfer means such as a transfer arm and a specific type of processing, e.g., etching or film formation, is executed on the wafer having been carried into the processing chamber. As increasingly fine circuit patterns have come to be formed through highly advanced micro-processing technologies in recent years, it has become necessary to position the wafer undergoing processing or inspection along the correct orientation with a high level of positioning accuracy in correspondence to the nano-order device design specifications (e.g., circuit line width of 65 nm). A notch mark such as an indented notch or a linear notch, which is often referred to as an orientation flat, is formed at part of the edge of the wafer, and the wafer is positioned by using this notch mark.

The wafer is usually positioned by, for instance, disposing a light emitting unit and a light receiving unit of a light-transmitting sensor so as to operate across the wafer edge. Light that is radiated toward the wafer edge is transmitted through the edge, and the notch mark is thus detected as the quantity of transmitted light changes at the notch mark.

In recent years, transparent wafers constituted of optical material or transparent material with superior light transmission characteristics and electrical insulation characteristics, such as sapphire, glass and quartz, have become fairly common as alternatives to the conventional silicon wafers. However, unlike a nontransparent wafer constituted of a nontransparent material such as silicon, a transparent wafer allows light to be transmitted over substantially the entire area thereof, and it has been assumed that a notch mark at the wafer edge cannot be detected with the light-transmitting sensor described above.

Accordingly, a light-reflecting sensor, instead of a light-transmitting sensor is used in conjunction with such a transparent wafer to detect the notch mark by radiating light from one side of the transparent wafer and receiving the light reflected from the wafer (see Japanese Laid Open Patent Publication No. H06-085038 and Japanese Laid Open Patent Publication No. H10-163301).

A light-transmitting sensor may be utilized to detect the edge area of a transparent wafer if the wafer has a portion formed along its edge over the entire circumference where vertical light is not allowed to advance straight, e.g., a beveled portion formed as a slanting surface over the entire circumference.

However, since light is transmitted through almost the entire area of a transparent wafer, there is a high likelihood of the light sensor generating saturated data (abnormal data) due to noise light such as disturbance light, regardless of whether the light sensor is a light-transmitting sensor or a light-reflecting sensor. For instance, if a pattern has been formed on the transparent wafer, noise light resulting from light diffraction manifesting at the pattern may be received by the light sensor and saturated data may be generated as a result. The term "saturated data" in this context refers to data indicating the maximum value that the light sensor is capable of detecting.

As described above, saturated data tend to be generated readily when the detection target is a transparent wafer. For this reason, if wafer edge shape data detected by the light sensor include a plurality of sets of saturated data indicating a noise area. A noise area may be erroneously judged to be the notch mark depending upon how the saturated data are distributed. Such an erroneous judgment leads to a problem in that the wafer positioning processing cannot be executed with accuracy.

It is to be noted that this problem may occur when the detection target wafer is a nontransparent wafer, as well as when the target wafer is a transparent wafer. For instance, abnormal data may be generated due to disturbance light or electrical noise when the detection target wafer is a nontransparent wafer, and in such a case, a noise area may be erroneously judged to be the notch mark formed at the wafer, depending upon the extent of variance in the abnormal data.

SUMMARY OF THE INVENTION

Accordingly, an object of the present invention, which has been completed by addressing the problems of the related art discussed above, it is to provide a substrate positioning device, a substrate positioning method and a program to be adopted to ensure that a noise area indicated by abnormal data such as saturated data is not erroneously judged to be a notch mark formed at the circumferential edge of the substrate, thereby improving the notch mark judgment accuracy.

MEANS FOR SOLVING THE PROBLEMS

The object described above is achieved in an aspect of the present invention by providing a substrate positioning device that detects a notch mark formed at a circumferential edge of a substrate and positions the substrate based upon the detected notch mark, comprising a rotary stage on which the substrate is placed so as to be rotatable, a sensor unit that includes a light sensor capable of detecting the circumferential edge of the substrate placed on the rotary stage and a control unit that obtains substrate edge shape data indicating detection values provided by the light sensor of the sensor unit and positions the substrate based upon the substrate edge shape data thus obtained. The control unit in the substrate positioning device executes noise reduction processing for detecting sudden abnormal data in the substrate edge shape data obtained from the sensor unit, eliminating the sudden abnormal data thus detected and interpolating the substrate edge shape data by using estimated substrate edge shape data generated based upon data from a surrounding area in place of the eliminated abnormal data, notch mark judgment processing for detecting a notch mark candidate in the substrate edge shape data having undergone the noise reduction processing and making a decision as to whether or not an error manifesting between sets of data sampled over an area corresponding to the detected notch mark candidate and an approximate curve obtained by curvilinearly approximating the sets of data over the area corresponding to the notch mark candidate satisfies a specific judgment condition and substrate positioning processing for positioning the substrate based upon a notch mark satisfying the specific judgment condition.

The object described above is also achieved in another aspect of the present invention by providing a substrate positioning method for detecting a notch mark formed at a circumferential edge of a substrate and positioning the substrate based upon the detected notch mark, comprising a data acquisition step for detecting the circumferential edge of the substrate with a light sensor and obtaining detection values provided by the light sensor as substrate edge shape data, a noise reduction step for detecting sudden abnormal data in the substrate edge shape data, eliminating the detected sudden abnormal data and interpolating the substrate edge shape data with estimated substrate edge shape data obtained based upon data from a surrounding area in place of the abnormal data, a notch mark judgment step for detecting a notch mark candidate in the substrate edge shape data having undergone the noise reduction step and making a decision as to whether or not an error, which has been generated due to a mismatch between data sampled over an area corresponding to the notch mark candidate having been detected and an approximate curve obtained by curvilinearly approximating the data over the area corresponding to the notch mark candidate, satisfies a predetermined judgment condition and a substrate positioning step for positioning the substrate based upon a notch mark satisfying the predetermined judgment condition.

By adopting the device or the method according to the present invention, sudden abnormal data (e.g., saturated data) in the substrate edge shape data provided by the light sensor can be eliminated and thus, abnormal data corresponding to a noise area where abnormal data that tend to readily cause an erroneous notch mark judgment manifest repeatedly, can be reduced. In addition, even when abnormal data are not eliminated and the corresponding noise area is detected as a notch mark candidate, a significant error manifests between the data of the notch mark candidate and an approximate curve obtained by curvilinearly approximating the notch mark candidate detected over the noise area, and thus, it is possible to disqualify the noise area as a notch mark candidate. As a result, a noise area corresponding to abnormal data such as saturated data is not erroneously judged to be the notch mark formed at the substrate edge and the notch mark judgment accuracy is improved.

In the noise reduction processing executed in the device or the method, each set of sampling data sampled at a given point and constituting the substrate edge shape data may be designated as target data, the target data may be compared with data sampled at a preceding point and a succeeding point and the sudden abnormal data may be detected by making a decision as to whether or not the target data deviate from the preceding data and the succeeding data by an extent equal to or greater than a predetermined first noise threshold value. In this case, the predetermined first noise threshold value should assume a value selected from a range over which at least three sets of data, sampled at a point equivalent to the vertex of an area corresponding to the notch mark and at points preceding and succeeding the point corresponding to the vertex in the sampling data for the notch mark area included in the substrate edge shape data, are not eliminated.

Through such noise reduction processing, abnormal data deviating from the preceding and succeeding data are eliminated from the substrate edge shape data and the substrate edge shape data are interpolated with estimated data generated based upon the preceding and succeeding data. This means that the estimated data can be obtained through calculation with ease. In addition, while abnormal data corresponding to a noise area that can be erroneously judged to be the notch mark are eliminated, data (e.g., data sampled at points around the vertex of the notch mark) needed in the notch mark judgment are retained and, as a result, the accuracy of the notch mark judgment is improved.

The predetermined judgment condition based upon which the decision is made in the notch mark judgment processing in the device or the method may be that in reference to the height of the notch mark candidate area represented by the approximate curve, the ratio of the error to the height of the notch mark candidate area does not exceed a predetermined first judgment threshold value. It is desirable that the predetermined first judgment threshold value be a value selected within a range of $1/40$ to $7/10$ of the height of the notch mark candidate area, and it is even more desirable to select a value that is $1/10$ of the height of the notch mark candidate area. By selecting such a threshold value, it is ensured that if the area corresponding to the actual notch mark is detected as a notch mark candidate, the data are not eliminated but retained intact and that only a noise area detected as a notch mark candidate is disqualified. As a result, the notch mark judgment accuracy is improved.

In the notch mark judgment processing executed in the device or the method, superimposed substrate edge shape data may be generated by offsetting and superimposing data corresponding to a half cycle in the substrate edge shape data having undergone the noise reduction processing and corresponding to one cycle of the substrate, over the data corresponding to the other half cycle, and a notch mark candidate may be detected by using the superimposed data. In this case, a sinewave component can be canceled out of the substrate edge shape data provided by the light sensor monitoring the substrate edge while the substrate placed on the rotary stage is rotated and, as a result, the adverse effect of decentering between the substrate center indicated in the substrate edge shape data and the rotational center at the rotary stage can be eliminated.

In the notch mark judgment processing executed in the device or the method, a prerequisite judgment condition that the number of sets of sampling data available in correspondence to the notch mark candidate is at least equal to or greater than a predetermined number may be set, and sampling data corresponding to the notch mark candidate satisfying this prerequisite judgment condition may be curvilinearly approximated through the method of least squares. In this case, the sampling data corresponding to the notch mark candidate are retained only when there are a sufficient number of sets of data that enable curvilinear approximation through the method of least squares.

The substrate undergoing the processing in the device or the method is a transparent wafer constituted of an optical material or a transparent material with superior light transmittance characteristics and electrical insulation characteristics, such as sapphire, glass or quartz. The wafer edge shape data of a transparent wafer tend to include saturated data (abnormal data). A great advantage is achieved by adopting the present invention in conjunction with a transparent wafer, since a noise area where such saturated data are sampled is not erroneously judged to be the notch mark.

The object described above is achieved in yet another aspect of the present invention by providing a substrate positioning device that detects a notch mark formed at a circumferential edge of a substrate and positions the substrate based upon the detected notch mark, comprising a rotary stage on which the substrate is placed, a sensor unit that includes a light sensor capable of detecting the circumferential edge of the substrate placed on the rotary stage and a control unit that obtains substrate edge shape data indicating detection values provided by the light sensor of the sensor unit and positions the substrate based upon the substrate edge shape data thus obtained. The control unit in the substrate positioning device executes first noise reduction processing for detecting sudden abnormal data in the substrate edge shape data, eliminating the sudden abnormal data thus detected and interpolating the substrate edge shape data by using estimated substrate edge shape data generated based upon data from a surrounding area in place of the eliminated abnormal data, second noise reduction processing for correcting individual sets of data, constituting the substrate edge shape data resulting from the first noise reduction processing based upon data sampled at surrounding areas, first judgment processing for detecting a notch mark candidate in the substrate edge shape data having undergone the second noise reduction processing and making a decision as to whether or not an error manifesting between sets of data sampled over an area corresponding to the detected notch mark candidate and an approximate curve obtained by curvilinearly approximating the sets of data over the area corresponding to the notch mark candidate satisfies a predetermined first judgment condition, second judgment processing for making a decision as to whether or not a coefficient in a curvilinear approximation expression of the approximate curve obtained in correspondence to a notch mark candidate judged to satisfy the first judgment condition through the first judgment processing satisfies a predetermined second judgment condition and substrate positioning processing for positioning the substrate based upon a notch mark judged to satisfy the second judgment condition through the second judgment processing.

The object described above is also achieved in yet another aspect of the present invention by providing a substrate positioning method for detecting a notch mark formed at a circumferential edge of a substrate and positioning the substrate based upon the detected notch mark, comprising a data acquisition step for detecting the circumferential edge of the substrate with a light sensor and obtaining detection values provided by the light sensor as substrate edge shape data, a first noise reduction step for detecting sudden abnormal data in the substrate edge shape data, eliminating the detected sudden abnormal data and interpolating the substrate edge shape data with estimated substrate edge shape data obtained based upon data from a surrounding area in place of the abnormal data, a second noise reduction step for correcting individual sets of data constituting the substrate edge shape data having undergone the first noise reduction step based upon data sampled in surrounding areas, a first judgment step for detecting a notch mark candidate in the substrate edge shape data resulting from the second noise reduction step and making a decision as to whether or not an error manifesting between sets of data sampled over an area corresponding to the detected notch mark candidate and an approximate curve obtained by curvilinearly approximating the sets of data over the area corresponding to the notch mark candidate satisfies a predetermined first judgment condition, a second judgment step for making a decision as to whether or not a coefficient in a curvilinear approximation expression of the approximate curve for a notch mark candidate judged to satisfy the first judgment condition through the first judgment step satisfies a predetermined second judgment condition and a substrate positioning step for positioning the substrate based upon a notch mark judged to satisfy the second judgment condition through the second judgment step.

In the device or the method according to the present invention described above, the first noise reduction processing is executed prior to the second noise reduction processing and, as a result, sudden saturated data are eliminated through the first noise reduction processing. As a result, data sampled over a noise area are not corrected to indicate values close to the values indicated over the actual notch mark through the second noise reduction processing. Thus, the noise area is not erroneously judged to be the notch mark formed at the wafer W in the notch mark judgment to be detailed later.

In addition, since the first judgment processing is executed prior to the second judgment processing, any noise area with deviant saturated data is disqualified as a notch mark candidate through the first judgment with regard to the error (offset) manifesting between the approximate curve and the notch mark sampling data. As a result, a further improvement in the notch mark judgment accuracy is achieved.

The object described above is also achieved in yet another aspect of the present invention by providing a program for detecting a notch mark formed at a circumferential edge of a substrate and positioning the substrate based upon the detected notch mark, which enables a computer to execute a data acquisition procedure for detecting the circumferential edge of the substrate with a light sensor and obtaining detection values provided by the light sensor as substrate edge shape data, a noise reduction procedure for detecting sudden abnormal data in the substrate edge shape data, eliminating the detected sudden abnormal data and interpolating the substrate edge shape data with estimated substrate edge shape data obtained based upon data from a surrounding area in place of the eliminated abnormal data, a notch mark judgment procedure for detecting a notch mark candidate in the substrate edge shape data having undergone the noise reduction procedure and making a decision as to whether or not an error manifesting between sets of data sampled over an area corresponding to the notch mark candidate having been detected, and an approximate curve obtained by curvilinearly approximating the sets of data over the area corresponding to the notch mark candidate satisfies a predetermined judgment condition and a substrate positioning procedure for positioning the substrate based upon a notch mark satisfying the predetermined judgment condition.

The object described above is also achieved in yet another aspect of the present invention by providing a program for detecting a notch mark formed at a circumferential edge of a substrate and positioning the substrate based upon the detected notch mark, which enables a computer to execute a data acquisition procedure for detecting the circumferential edge of the substrate with a light sensor and obtaining detection values provided by the light sensor as substrate edge shape data, a first noise reduction procedure for detecting sudden abnormal data in the substrate edge shape data, eliminating the detected sudden abnormal data and interpolating the substrate edge shape data with estimated substrate edge shape data obtained based upon data from a surrounding area in place of the eliminated abnormal data, a second noise reduction procedure for correcting individual sets of data, constituting the substrate edge shape data having undergone the first noise reduction procedure based upon data sampled in surrounding areas, a first judgment procedure for detecting a notch mark candidate in the substrate edge shape data resulting from the second noise reduction procedure and making a decision as to whether or not an error manifesting between sets of data sampled over an area corresponding to the detected notch mark candidate and an approximate curve obtained by curvilinearly approximating the sets of data over the area corresponding to the notch mark candidate satisfies a predetermined first judgment condition, a second judgment procedure for making a decision as to whether or not a coefficient in a curvilinear approximation expression of the approximate curve for a notch mark candidate, judged to satisfy the first judgment condition through the first judgment procedure, satisfies a predetermined second judgment condition and a substrate positioning procedure for positioning the substrate based upon a notch mark judged to satisfy the second judgment condition through the second judgment procedure.

By executing either program according to the present invention described above, a noise area corresponding to abnormal data such as saturated data is not erroneously judged to be the notch mark formed at the substrate edge and the notch mark judgment accuracy is improved.

DETAILED DESCRIPTION OF THE PREFERRED EMBODIMENTS

Figure 1:
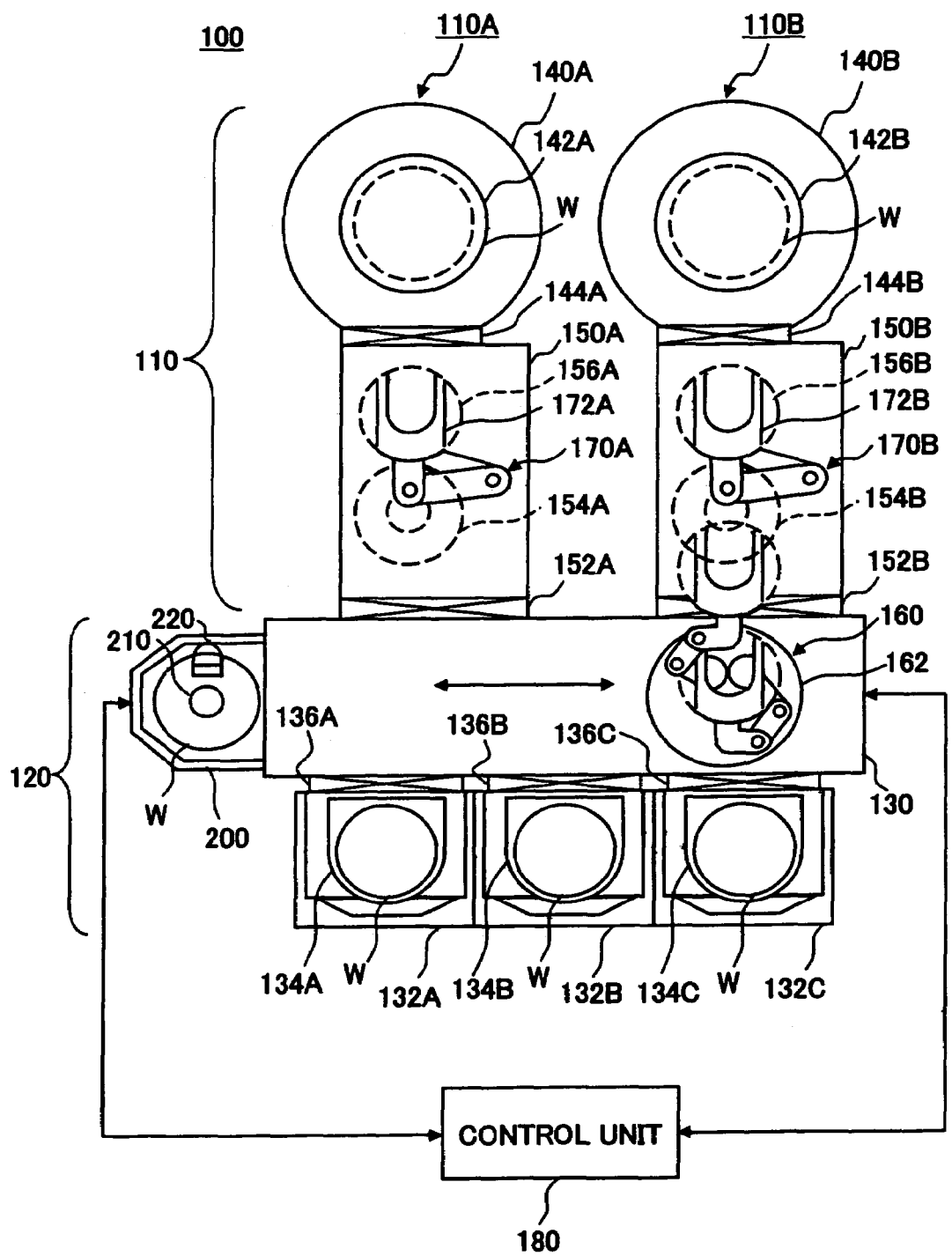
FIG. 1 is a sectional view presenting a structural example that may be adopted in the substrate processing apparatus achieved in an embodiment of the present invention.

The following is a detailed explanation of the preferred embodiments of the present invention, given in reference to the attached drawings. It is to be noted that in the specification and the drawings, the same reference numerals are assigned to components having substantially identical functions and structural features to preclude the necessity for a repeated explanation thereof.

(Structural Example for Substrate Processing Apparatus)

First, a structural example that may be adopted in the substrate processing apparatus in an embodiment of the present invention is explained in reference to a drawing. The substrate processing apparatus in this example includes at least one vacuum processing unit connected to a transfer chamber. FIG. 1 is a sectional view schematically illustrating the structure of the substrate processing apparatus achieved in the embodiment. The substrate processing apparatus 100 includes either a single vacuum processing unit 110 or a plurality of vacuum processing units 110 where various types of processing such as film formation and etching are executed on a substrate, e.g., a wafer W, in order to manufacture a semiconductor device, and a transfer unit 120 that transfers the wafer W into/out of each vacuum processing unit 110. The transfer unit 120 includes a common transfer chamber 130 used to transfer wafers W.

In the example presented in FIG. 1, two vacuum processing units 110A and 110B are disposed along a side surface of the transfer unit 120. The vacuum processing units 110A and 110B respectively include processing chambers 140A and 140B and evacuatable load-lock chambers 150A and 150B disposed continuous to the processing chambers. In the processing chambers 140A and 140B of the vacuum processing units 110A and 110B, a single type of processing or different types of processing can be executed on wafers W. Inside the processing chambers 140A and 140B, stages 142A and 142B on which wafers W can be placed are disposed. It is to be noted that the number of vacuum processing units 110, each comprising a processing chamber 140 and a load-lock chamber 150, is not limited to two, and additional vacuum processing units may be disposed.

The transfer chamber 130 at the transfer unit 120 is formed as a box with a substantially rectangular section, where an inert gas such as $N_2$ gas or clean air is circulated. A plurality of cassette tables 132A through 132C are disposed side-by-side at one of the side surfaces of the transfer chamber 130 ranging along the longer side of the substantially rectangular section. The cassette tables 132A and 132B function as substrate standby ports, at which cassette containers 134A through 134C are placed. While FIG. 1 shows three cassette containers 134A through 134C each placed on one of the cassette tables 132A through 132C, the numbers of the cassette tables and cassette containers are not limited to this example and there may be one or two cassette tables and cassette containers, or there may be four or more cassette tables and cassette containers.

At each of the cassette containers 134A through 134C, up to 25 wafers W can be stored in multiple racks with equal pitches. The cassette containers assume a sealed structure with, for instance, an $N_2$ gas atmosphere filling the space therein. Wafers W can be carried into/out of the transfer chamber 130 via gate valves 136A through 136C.

A common transfer mechanism (atmospheric pressure-side transfer mechanism) 160 that transfers a wafer W along the length (along the direction indicated by the arrow in FIG. 1) thereof is disposed inside the transfer chamber 130. The common transfer mechanism 160 is fixed onto, for instance, a base 162 and the base 160 is allowed to slide on a guide rail (not shown) disposed over the central area of the transfer chamber 130 so as to extend along the length thereof via, for instance, a linear motor drive mechanism. The common transfer mechanism 160 may be a double-arm mechanism equipped with two end-effectors, as shown in FIG. 1, or it may be a single-arm mechanism-equipped with a single end-effector.

At an end of the transfer chamber 130, i.e., at one side surface ranging along the shorter side of the substantially rectangular section, a positioning device (e.g., an orienter or a pre-alignment stage) 200 is disposed. The positioning device 200 positions (aligns) a wafer W. This positioning device 200 is to be described in detail later.

At the other side surface of the transfer chamber ranging along the longer side of the substantially rectangular section, the base ends of the two load-lock chambers 150A and 150B are connected via switchable gate valves (atmospheric pressure-side gate valves) 152A and 152B. The front ends of the load-lock chambers 150A and 150B are respectively connected to the processing chambers 140A and 140B via switchable gate valves (vacuum pressure-side gate valves) 144A and 144B.

In the load-lock chambers 150A and 150B, a pair of buffer stages 154A and 156A and a pair of buffer stages 154B and 156B on which wafers W are temporarily held in standby are respectively disposed. In the explanation, the buffer stages 154A and 154B disposed closer to the transfer chamber are referred to as first buffer stages, whereas the buffer stages 156A and 156B disposed on the other side are referred to as second buffer stages. Individual transfer mechanisms (vacuum pressure-side transfer mechanisms) 170A and 170B, each constituted with an articulated arm capable of flexing, rotating and moving up/down, are disposed respectively between the buffer stages 154A and 156A and between the buffer stages 154B and 156B.

At the front ends of the individual transfer mechanisms 170A and 170B, end-effectors 172A and 172B are respectively disposed, so that wafers W can be transferred between the first and second buffer stages 154A and 156A and between the first and second buffer stages 154B and 156B via the end-effectors 172A and 172B respectively. It is to be noted that wafers are carried from the load-lock chambers 150A and 150B to the processing chambers 140A and 140B and vice versa via the respective individual transfer mechanisms 170A and 170B.

The substrate processing apparatus 100 includes a control unit 180 that controls the overall operations executed in the substrate processing apparatus, including operational control for the transfer mechanisms 160 and 170 and the gate valves 136, 144 and 156 as well as the positioning device 200. The control unit 180 includes a microcomputer constituting the main body of the control unit 180, a memory in which various types of data are stored and the like.

When executing wafer processing in the substrate processing apparatus structured as described above, a wafer W taken out of a given cassette container among the cassette containers 134A through 134C by the common transfer mechanism 160 is first carried into the positioning device 200 where it is positioned (aligned). Then, the wafer W is transferred back to the common transfer mechanism 160 which carries it into the load-lock chamber 150A or 150B of the vacuum processing unit 110A or 110B where it is to undergo the processing. The wafer W is carried into the processing chamber 140A or 140B on the individual transfer mechanism 170A or 170B, and once in the processing chamber 140A or 140B, the wafer W undergoes a specific type of processing such as etching executed by using a processing gas. When the processing in the processing chamber 140A or 140B ends, the processed wafer W is taken back to the load-lock chamber 150A or 150B by the individual transfer mechanism 170A or 170B, and then it is carried back into the cassette container among the cassette containers 134A through 134C by the common transfer mechanism 160 via the transfer chamber 130.

As increasingly fine circuit patterns have come to be formed through highly advanced microprocessing technologies in recent years, it has become necessary to position the wafer undergoing processing or inspection along the correct orientation with a high level of positioning accuracy in correspondence to the nano-order device design specifications (e.g., circuit line width of 65 nm).

Figure 2:
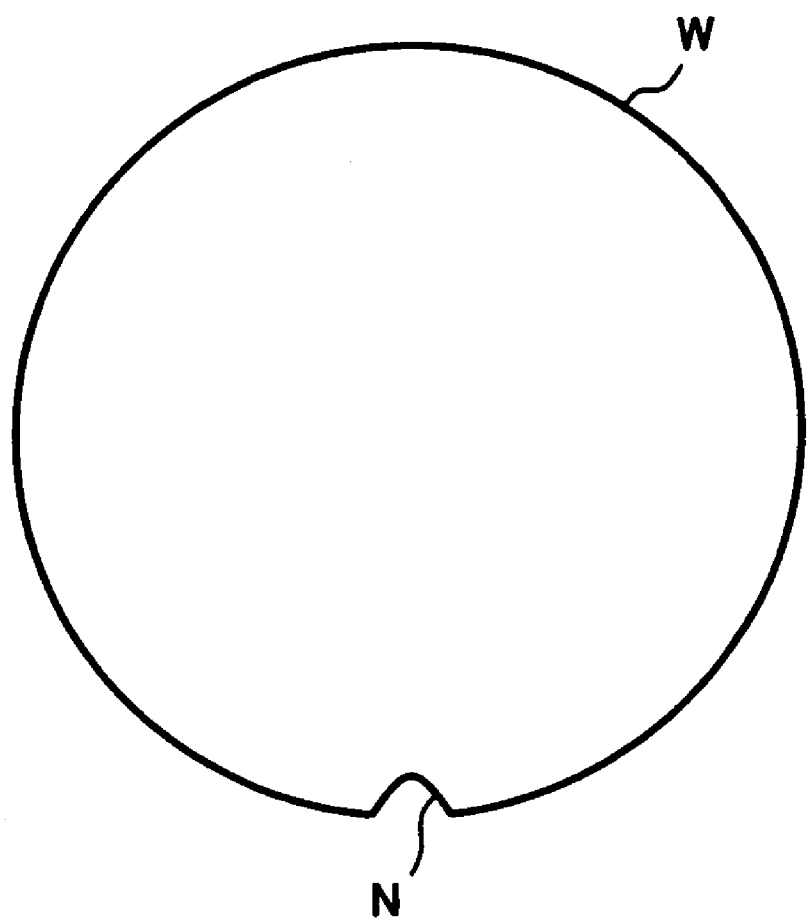
FIG. 2 presents a specific example of a notch mark that may be formed at a wafer.

Accordingly, the positioning device 200 achieved in the embodiment detects a notch mark (e.g., a notch N constituted with a cutout, such as that shown in FIG. 2) formed on part of the circumferential edge of the wafer W and thus accurately detects the orientation of the wafer W through the wafer positioning processing to be detailed later. As a result, the orientation of the wafer W can be adjusted accurately along a specific direction.

(Structural Example for Positioning Device)

Figure 3:
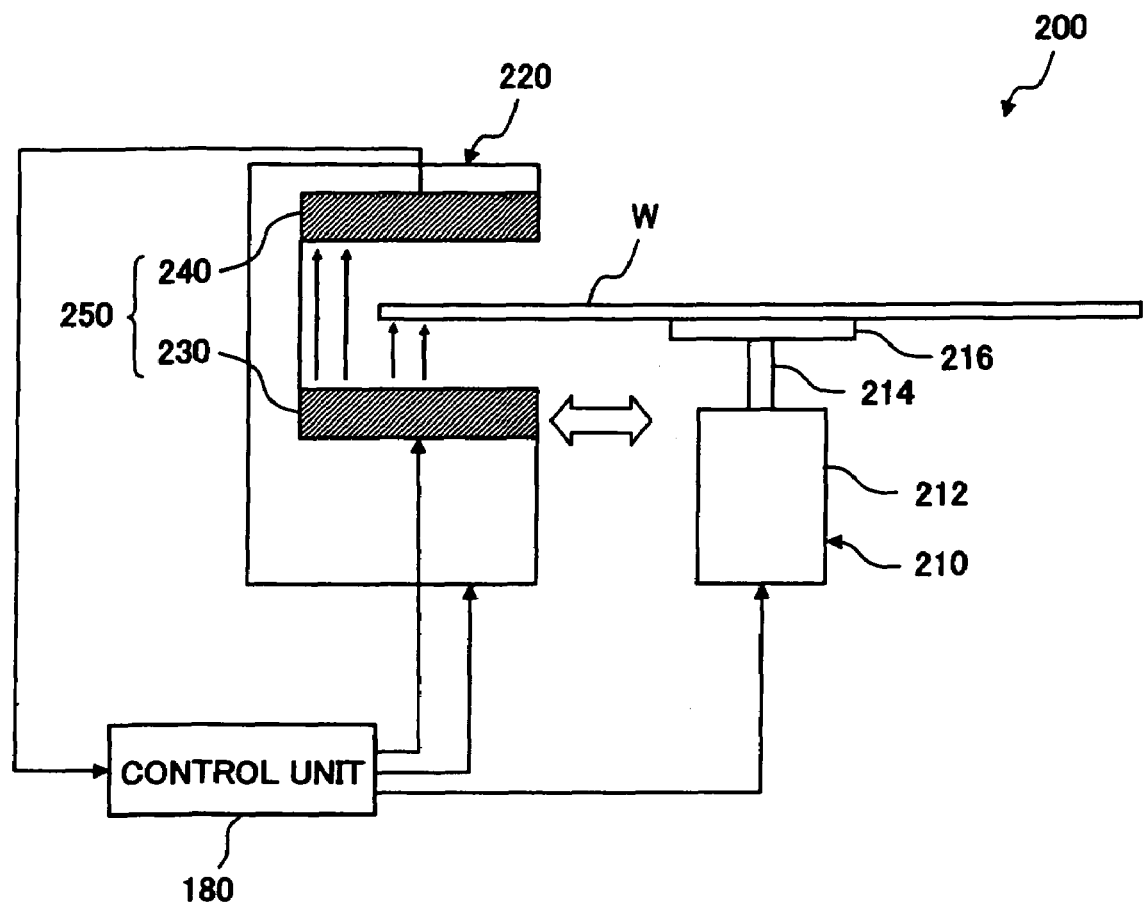
FIG. 3 is a schematic diagram showing a specific internal structure that may be adopted in the positioning device in the embodiment.
Figure 4:
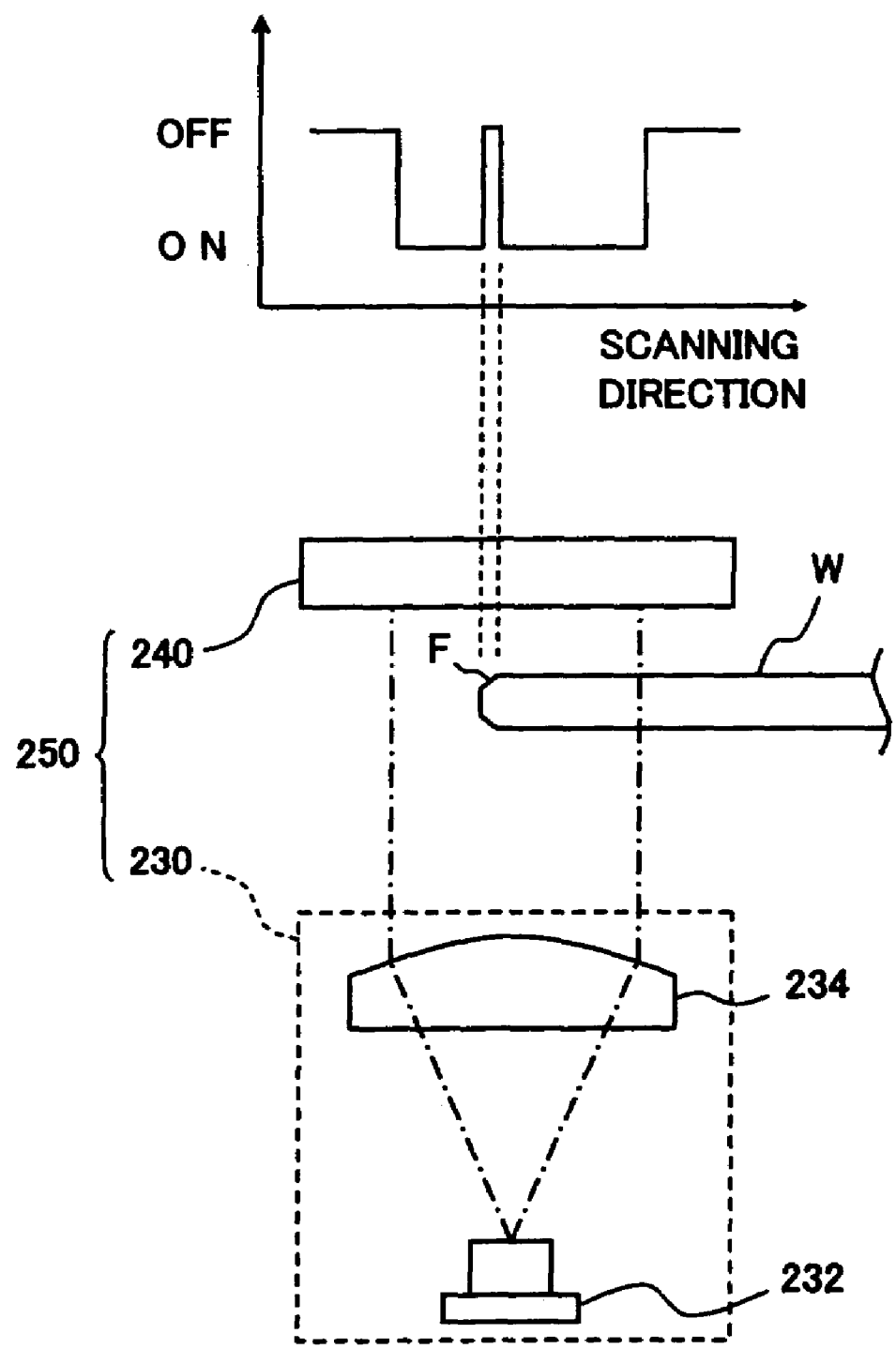
FIG. 4 illustrates the principal of the wafer edge detection executed by the positioning device in the embodiment.

A specific structural example that may be adopted in the positioning device is now explained in reference to drawings. FIG. 3 schematically illustrates an example of an internal structure that may be adopted in the positioning device 200. FIG. 4 illustrates the principal of the wafer edge detection executed by the positioning device 200. The positioning device 200 is constituted by disposing inside a substantially cylindrical container a rotary stage 210 on which the wafer W is placed and a sensor unit 220 that detects the circumferential edge of the wafer W with a light-transmitting sensor 250.

The rotary stage 210 may include, for instance, a drive unit 212, a rotating drive shaft 214 extending from the drive unit 212 and a rotary plate 216 fixed onto the rotating drive shaft 214, on which the wafer W is placed. The rotary plate 216 is allowed to move up/down freely and is also made to rotate by a specific extent by a motive force transmitted by the drive unit 212 via the rotating drive shaft 214. The rotary stage 210 is connected to the control unit 180 and its drive is controlled in response to a control signal provided by the control unit 180.

It is to be noted that while the outer diameter of the rotary plate 216 is set smaller than the outer diameter of the wafer W, the rotary plate 216 should still be large enough to fully support the wafer W as it rotates. In addition, a rubber pad or an electrostatic holding pad (not shown) is disposed at the upper surface of the rotary plate 216 so that the wafer W placed on the rotary plate 216 is held fast against the centrifugal force while the rotary plate 216 rotates.

The sensor unit 220 includes a light-transmitting sensor 250, representing an example of a detection means for detecting the circumferential edge of the wafer W. The light-transmitting sensor 250 includes a light emitting unit 230 and a light receiving unit 240, which are disposed so as to operate across the circumferential edge of the wafer W set on the rotary stage 210. More specifically, the light emitting unit 230 may be disposed so that it assumes a position under the wafer W and the light receiving unit 240 may be disposed so that it assumes a position above the wafer W.

It is to be noted that the light emitting unit 230 and the light receiving unit 240 of the light-transmitting sensor 250 are individually connected to the control unit 180 so that the light emitting unit 230 is controlled based upon a control signal provided by the control unit 180 and a signal from the light receiving unit 240 is transmitted to the control unit 180. In addition, the sensor unit 220 is allowed to move reciprocally along the radius of the wafer W by a sensor unit drive unit (not shown). The sensor unit drive unit is connected to the control unit 180 and its drive is controlled in response to a control signal provided by the control unit 180.

The light emitting unit 230 includes a light emitting element 232 such as a light emitting diode and a lens 234, as shown in FIG. 4. It is to be noted that a slit (not shown) may be formed above the lens 234 in the light emitting unit 230 to improve the rectilinear propagation characteristics of light by reducing the adverse effect of disturbance light on the transmitted light received at the light receiving unit 240. The light receiving unit 240 is constituted with an image-capturing element such as a CCD (charge coupled device) sensor. Alternatively, the light receiving unit may be constituted with a photo sensor element such as a photodiode.

Light emitted from the light emitting element 232 at the light emitting unit 230 of the sensor unit 220 structured as described above is received at the light receiving element of the light receiving unit 240 via the lens 234, and is converted to a position signal. The position signal resulting from the conversion is then transmitted to the control unit 180. The signal transmitted to the control unit 180 is used in positioning processing and the like executed for the wafer W by the control unit 180. Based upon position information with regard to the wafer W, obtained through the wafer positioning processing, the control unit 180 controls the rotary stage 210 via the drive unit 212 and also controls the common transfer mechanism 160 to position (align) the wafer W. It is to be noted that the positioning processing executed for the wafer W is to be described in detail later.

As a wafer W is placed on the rotary plate 216 of the rotary stage 210 via, for instance, the common transfer mechanism 160, the wafer W is electrostatically held onto the rotary plate 216 in the positioning device 200. Then, while the wafer W rotates together with the rotary plate 216, light is radiated from the light emitting unit 230 and transmitted light is received at the light receiving unit 240. The signal over an area where the wafer W is not present indicates an ON level, whereas the signal over the area where the circumferential edge of the wafer W is present, blocking the optical path between the light emitting unit 230 and the light receiving unit 240 indicates an OFF level, thereby enabling detection of the circumferential edge of the wafer W. By detecting the position of the edge of the wafer W while the wafer W rotates one full cycle, wafer edge shape data, which constitute information related to the shape of the wafer W at its edge, can be collected.

(Wafer Edge Shape Data)

Figure 5A:
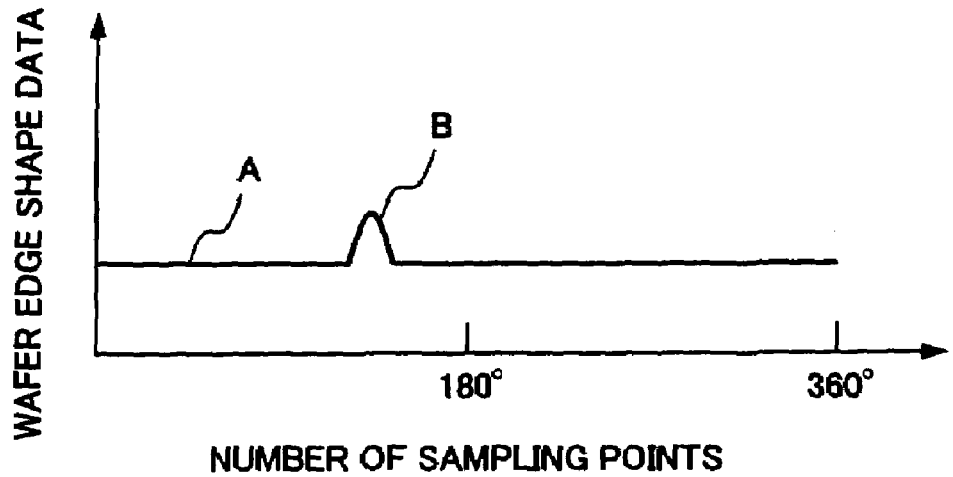
FIGS. 5A, 5B and 5C show wafer edge shape data that may be sampled in the embodiment.
Figure 5B:
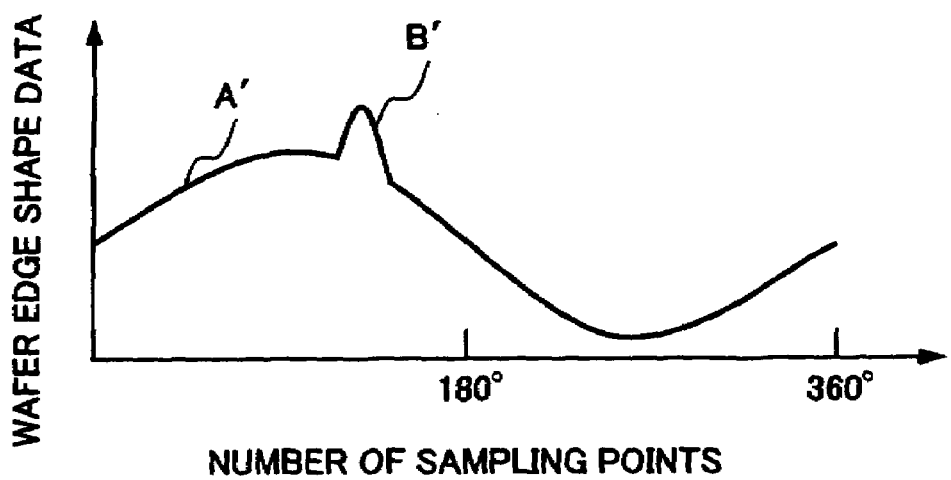
Figure 5C:
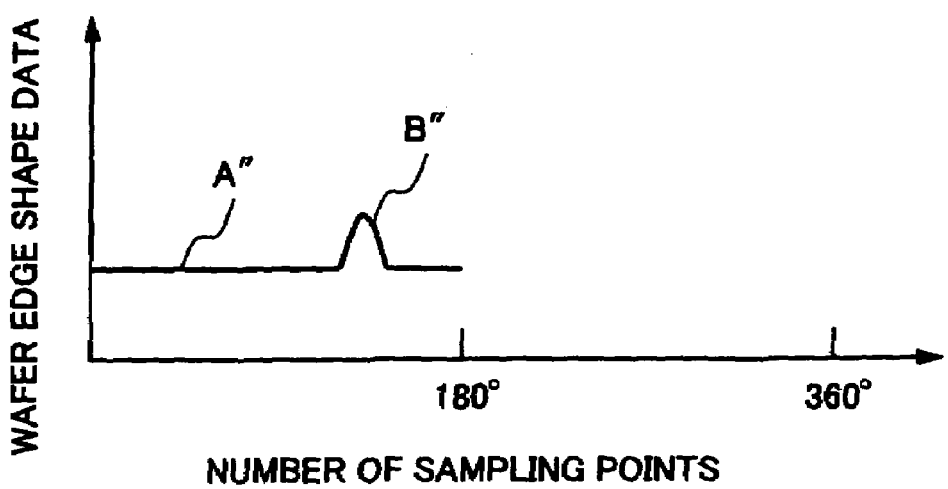

In reference to a drawing, the wafer edge shape data are explained. FIG. 5 shows wafer edge shape data, with FIG. 5A presenting a graph of wafer edge shape data sampled when the center of the wafer W and the rotational center at the rotary stage 210 are aligned and FIG. 5B presenting a graph of wafer edge shape data sampled when the center of the wafer W and the rotational center at the rotary stage are not aligned. FIG. 5C presents a graph obtained by offsetting and superimposing the data corresponding to half a cycle in the graph in FIG. 5B over the data corresponding to the other half cycle.

Since the shape at the edge of the substantially circular wafer remains constant, the wafer edge shape data are represented by a substantially horizontal straight line indicated by the solid line A in FIG. 5A except for the area B corresponding to the notch mark, as long as the center of the wafer W and the rotational center of the rotary stage 210 are aligned.

However, it is difficult to accurately align the center of the wafer W, which is set on the rotary stage 210 via the common transfer mechanism 160, with the rotational center at the rotary stage 210. For this reason, the center of the wafer W and the rotational center of the rotary stage 210 are offset from each other and thus, the actual wafer edge shape data are represented by a substantially sinusoidal curve, as indicated by the solid line A' in FIG. 5B except for the area B' corresponding to the notch mark.

Accordingly, in order to accurately detect the notch mark at the wafer W based upon the wafer edge shape data shown in FIG. 5B, superimposed data are generated by offsetting the wafer edge shape data corresponding to half a cycle (180°) in the wafer edge shape data sampled over a full cycle, i.e., wafer edge shape data sampled while the wafer W rotates once (360°), such as those shown in FIG. 5B, and superimposing the half cycle wafer edge shape data over the wafer edge shape data corresponding to the other half cycle. Such superimposed wafer edge shape data are represented by a substantially horizontal straight line, as indicated by the solid line A" in FIG. 5C except for the area B" corresponding to the notch mark. Since the sinewave component is canceled out in these superimposed wafer edge shape data, the adverse effect of the offset between the center of the wafer W and the rotational center of the rotary stage 210 on the wafer edge shape data is eliminated to allow accurate detection of the notch mark (area B) at the wafer W.

(Nontransparent Wafer and Transparent Wafer)

Now, the wafer W to be positioned by the positioning device 200 achieved in the embodiment is explained. The wafer W, positioned by the positioning device 200 achieved in the embodiment may be a nontransparent wafer W constituted of a nontransparent material such as silicon, or it may be a transparent wafer W constituted of an optical material or a transparent material with desirable light transmission characteristics and electrical insulation characteristics, such as sapphire (aluminum oxide single crystal substrate), glass or quartz ($SiO_2$). Namely, the transparent wafer W positioned by the positioning device achieved in the embodiment may be a sapphire substrate, a glass substrate, a quartz wafer or an SOS (silicon-on-sapphire) substrate.

The sapphire substrate may be used when manufacturing, for instance, an LCD backlight surface light emitting LED or the like, a glass substrate may be used when manufacturing, for instance, an infrared cut-off filter (IR cut-off filter) or the like, and a quartz wafer may be used for, for instance, MEMS (micro electromechanical system). It is to be noted that an SOS substrate is a composite substrate constituted with silicon and sapphire.

When the target wafer to be positioned by the positioning device 200 is a nontransparent wafer W, the light from the light emitting unit 230 is transmitted through an area where the nontransparent wafer W is not present but is not transmitted through an area over which the nontransparent wafer W is present. Thus, the edge of the wafer W at the boundary of these areas can be detected with ease. In contrast, when the target wafer to be positioned by the positioning device 200 is a transparent wafer W, light is transmitted over most of the areas where the transparent wafer W is present as well as through the area where the transparent wafer W is not present and, for this reason, detection of the circumferential edge of the transparent wafer W is considered to be more difficult than the detection of the circumferential edge of the nontransparent wafer W.

However, even when the positioning target is a transparent wafer W such as that described above, the edge of the transparent wafer W can be detected by using the light-transmitting sensor 250 to detect an area (e.g., a beveled area) formed along the edge of the wafer W over its entire circumference which does not allow beams traveling perpendicular to the wafer to advance straight.

For instance, at a beveled portion F formed as a slanted surface along the edge of the wafer W over its entire circumference, as shown in FIG. 4, the light from the light emitting unit 230 is reflected and the signal received at the light receiving unit 240 over the range where the beveled portion F is formed indicates an OFF level. Accordingly, the edge of the transparent wafer W is detected in the embodiment by detecting the beveled portion F of the wafer W. Consequently, the circumferential edge of the transparent wafer W can be detected just as easily as the circumferential edge of the nontransparent wafer W.

FIG. 4 presents a graph of the waveform indicating the quantity of light received at the light receiving unit 240 when the light from the light emitting unit 230 is radiated onto the circumferential edge of the transparent wafer W. The horizontal axis of the graph in FIG. 4 indicates the position of the sensor unit 220 along the scanning direction, whereas the quantity of light received at the light receiving unit 240 is indicated along the vertical axis. The received light quantity level enters an ON state if light is transmitted, whereas it enters an OFF state if no light is transmitted.

As shown in FIG. 4, light from the light emitting unit 230 is transmitted through most of the area where the transparent wafer W is present, as well as through the area where the transparent wafer W is not present and thus, the quantity of light received at the light receiving unit 240 mostly indicates an ON level. However, the quantity of light received at the light receiving unit 240 in correspondence to the area where the beveled portion F is formed at the transparent wafer W indicates an OFF level, as shown in FIG. 4. Accordingly, the area where the quantity of light received at the light receiving unit 240 indicates an OFF level over a predetermined range can be judged to be the beveled portion F of the transparent wafer W and the position at which this area is present can be detected as the circumferential edge of the transparent wafer W.

As a result, the circumferential edge of the transparent wafer W can be detected just as easily as the circumferential edge of the nontransparent wafer W, which allows the positioning device 200 to position the transparent wafer W equally effectively by adopting the structure for positioning the nontransparent wafer W. In other words, the positioning device 200 is able to position both the transparent wafer W and the nontransparent wafer W equally effectively.

The wafer edge shape data are obtained by detecting the wafer circumferential edge in correspondence to a single rotation (single cycle) of the wafer with the sensor unit 220 while the wafer W placed on the rotary stage 210 is rotated.

However, since the transparent wafer W ranges over a narrow area along the radio direction at the beveled portion F, it is more readily affected by disturbance light, compared to the nontransparent wafer W. For instance, if a pattern is formed on the transparent wafer W, the light receiving unit 240 may receive noise light attributable to a light diffraction phenomenon or the like occurring at the pattern.

Thus, if noise light is received within the range of the beveled portion F while detecting part of the circumferential edge of the transparent wafer W and the signal over the range indicates an ON level, the wafer circumferential edge over this area cannot be detected. Namely, while the sensor unit 220 is scanned further toward the center of the wafer W, the sensor unit 220 moves past the beveled portion F of the transparent wafer W and thus, the edge of the wafer W over this area cannot be detected. Under such circumstances, the wafer edge shape data are provided as saturated data (abnormal data) indicating an ON level.

Figure 6:
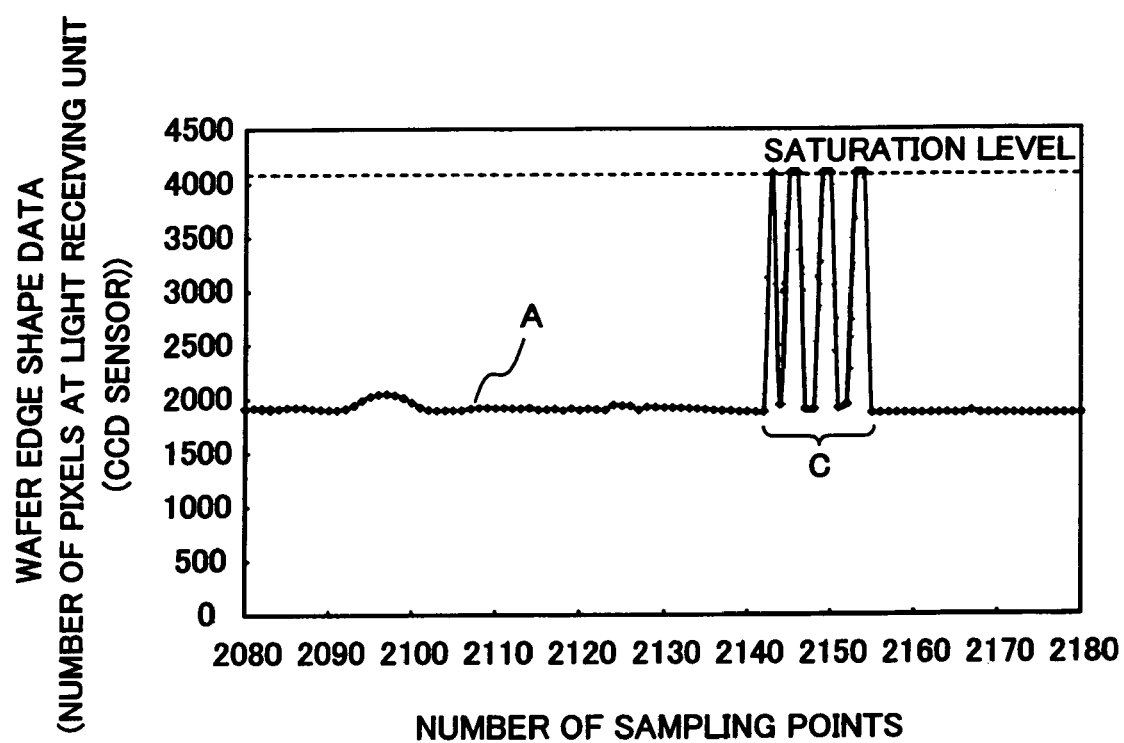
FIG. 6 presents a specific example of saturated data (abnormal data) that may be sampled in the embodiment.

Saturated data in this case indicates the maximum value of the quantity of light that can be detected by the light receiving unit 240. For instance, assuming that the light receiving unit 240 is constituted with a CCD sensor and that the received light quantity is indicated by the number of pixels, the saturated data indicate the maximum number of pixels at which light can be detected at the CCD sensor. The value indicated by the saturated data is a value provided when no detection point is detected within the detection range of, for instance, a CCD sensor. FIG. 6 presents a specific example of such saturation data (abnormal data). FIG. 6 shows part of the wafer edge shape data, with the number of sampling points (equivalent to the wafer rotational angles) indicated along the horizontal axis and the wafer edge shape data indicated along the vertical axis. The sampling data over an area A in FIG. 6 are represented by a substantially straight line, indicating the shape of the wafer circumferential edge. The data over an area C, on the other hand, indicate a noise area where saturated data indicating a saturation level manifests. Over the area C, sudden saturated data manifest repeatedly. In other words, the data fluctuate between the level at the area A and the saturation level almost continuously.

If a plurality of sets of saturated data manifest as a noise area in part of the wafer edge shape data corresponding to one rotation of the wafer (one cycle), the noise area (e.g., the area C in FIG. 6) may be erroneously judged to be a notch mark formed at the wafer W, depending upon the manner with which the saturated data are distributed (e.g., sudden saturated data manifesting repeatedly as in the area C in FIG. 6). Such an erroneous judgment disallows accurate execution of wafer positioning processing.

Accordingly, the positioning processing executed for the wafer W according to the present invention includes noise reduction processing through which any sudden saturated data (abnormal data) are eliminated as noise and notch mark judgment processing executed unaffected by saturated data (abnormal data). The positioning processing for the wafer W can thus be executed accurately without being affected by saturated data (abnormal data) that may manifest when positioning a transparent wafer W.

(Wafer Positioning Processing)

Figure 7:
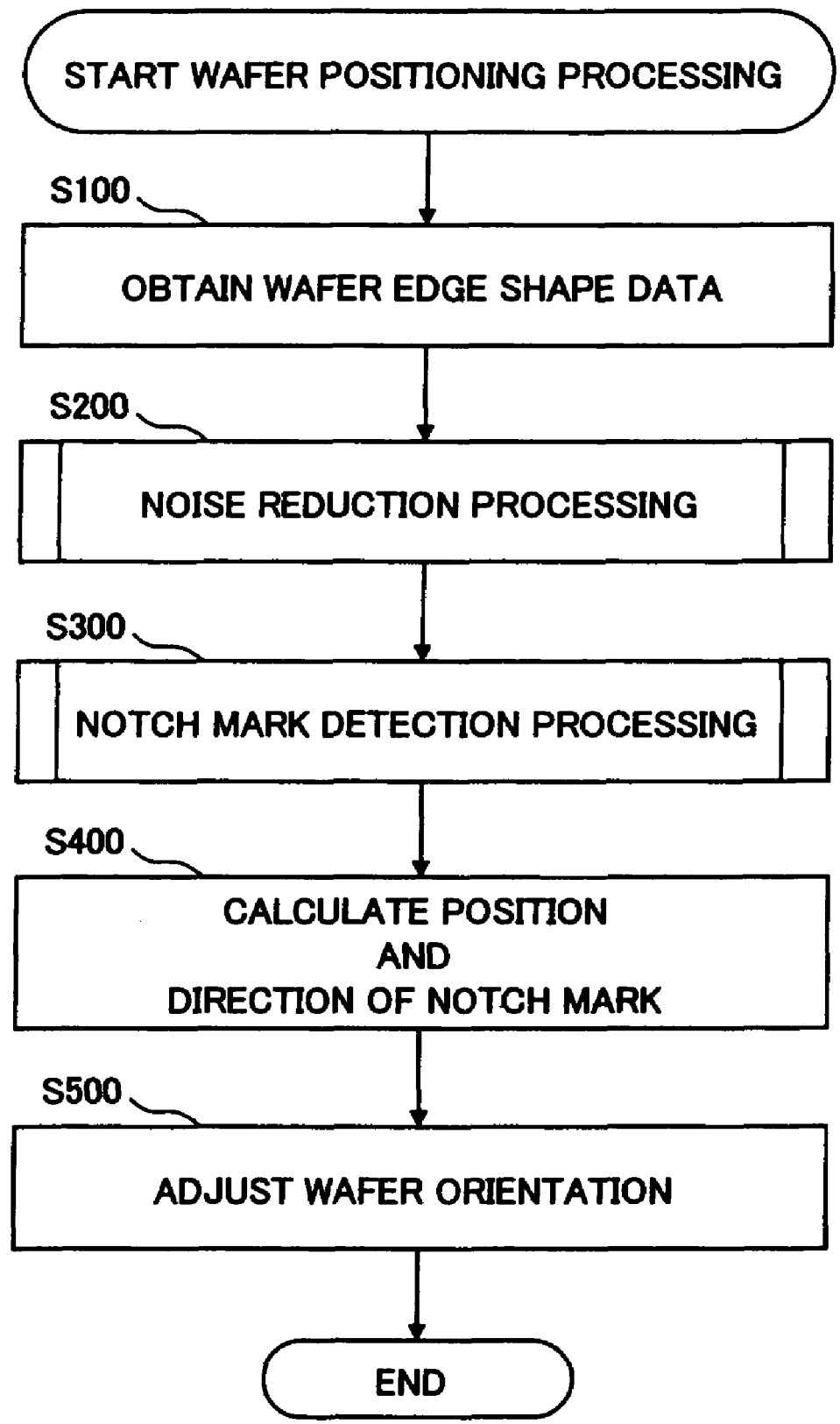
FIG. 7 presents a flowchart of a specific example of the wafer positioning processing executed in the embodiment.

Next, a specific example of the wafer positioning processing executed by engaging the positioning device 200 described above is explained in reference to the drawing. FIG. 7 presents a flowchart of the specific example of the wafer positioning processing. In the embodiment, the positioning processing for the wafer W is executed by the control unit 180 by reading out and executing program data.

The positioning processing for the wafer W is executed as shown in FIG. 7 by first obtaining the wafer edge shape data in step S100 in the embodiment. More specifically, while the wafer W placed on the rotary stage 210 is rotated, sampling data (e.g., wafer edge shape data such as those shown in FIG. 6) sampled at the wafer edge by radiating light onto the wafer edge and receiving the transmitted light while the wafer on the rotating stage 210 rotates one full cycle, are received at the sensor unit 220. The sampling data are then stored into an actual data storage area at a storage means constituted with a memory in, for instance, the control unit 180.

(Noise Reduction Processing)

Figure 8:
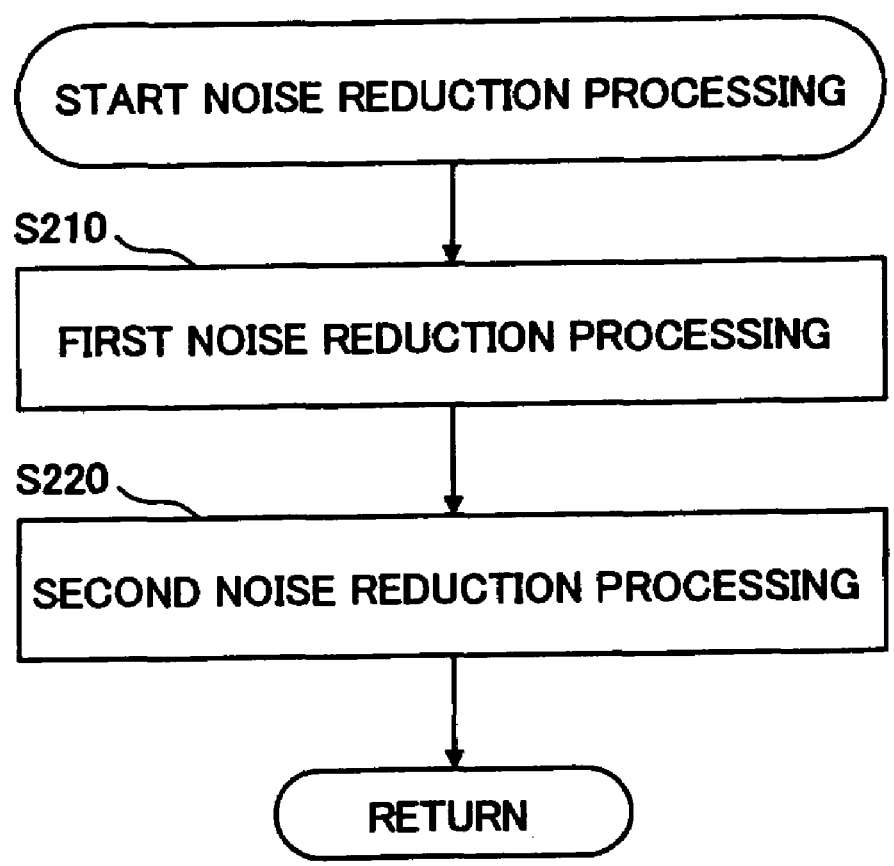
FIG. 8 presents a flowchart of a specific example of the noise reduction processing in FIG. 7.

Next, in step S200, noise reduction processing is executed to reduce noise contained in the wafer edge shape data having been sampled by the sensor unit 220. FIG. 8 presents a flowchart of a specific example of the noise reduction processing. As shown in FIG. 8, the noise reduction processing in the embodiment includes two stages of processing, i.e., first noise reduction processing (step S210) and second noise reduction processing (step S220) following the first noise reduction processing.

First, the first noise reduction processing is described. Through the first noise reduction processing, sudden abnormal data such as saturated data are eliminated as noise and the wafer edge shape data are interpolated with estimated wafer edge shape data generated based upon the sampling data sampled at the surrounding points in place of the eliminated abnormal data. For instance, the first noise reduction processing may be executed on the actual wafer edge shape data, and the data having undergone the processing may be stored as processing data into a processing data processing area in the control unit 180. In this case, sudden abnormal data are not allowed to adversely affect the judgment made with regard to the notch mark at the wafer W.

The first noise reduction processing may be executed as follows. First, sudden abnormal data in the wafer edge shape data are detected. More specifically, a decision is made as to whether or not each set of sampling data in the wafer edge shape data, sampled at a given point, is sudden abnormal data. Namely, a given set of data designated as the judgment target is compared with data sampled at a preceding sampling point and the data sampled at the following sampling point and a decision is made as to whether or not the target data deviate from the preceding and succeeding data by an extent equal to or greater than a first noise threshold value (first noise judgment condition).

This first noise judgment condition may be expressed as in (1-1) and (1-2) below in which $t_a$ represents the target data, $t_{a-1}$ represents the data immediately preceding the target data $t_a$, $t_{a+1}$ represents the data immediately succeeding the target data $t_a$ and $m_1$ represents the first noise threshold value.

$$t_a - t_{a-1} > m_1 \quad (1\text{-}1)$$

$$t_a - t_{a+1} > m_1 \quad (1\text{-}2)$$

The decision with regard to the first noise judgment condition may be made by storing the target data $t_a$, the immediately preceding data $t_{a-1}$ and the immediately succeeding data $t_{a+1}$ in the wafer edge shape data in the actual data storage area respectively into a target data storage area, an immediately preceding data storage area and an immediately succeeding data storage area at a storage means constituted with a memory or the like at the control unit 180 and comparing these data.

If the target data $t_a$ satisfy both expressions (1-1) and (1-2), the target data $t_a$ are judged to be sudden abnormal data. If, on the other hand, the target data do not satisfy both expressions (1-1) and (1-2), i.e., if the target data satisfy neither expression (1-1) or (1-2), or if the target data satisfy only either (1-1) or (1-2), the target data $t_a$ are judged not to be sudden abnormal data.

If the target data $t_a$ are judged not to be sudden abnormal data, the target data $t_a$ are not eliminated. In such a case, the target data $t_a$ are retained as processing data in the processing data processing area.

If, on the other hand, the target data $t_a$ are judged to be sudden abnormal data, the target data $t_a$ are eliminated. Then, the average of the values indicated by the immediately preceding data $t_{a-1}$ and the immediately succeeding data $t_{a+1}$ is calculated to be used as estimated data $t_a'$, and the estimated data $t_a'$ are used to interpolate the wafer edge shape data in place of the eliminated target data $t_a$. Accordingly, the estimated data $t_a'$ instead of the target data $t_a$ are stored as processing data in the processing data processing area.

Sudden abnormal data cannot be eliminated if too large a value is selected for the first noise threshold value $m_1$. However, if the first noise threshold value $m_1$ assumes a value that is excessively small, data corresponding to the vertex of the notch mark may be erroneously judged to be sudden abnormal data and be eliminated. If the data corresponding to the vertex of the notch mark are eliminated, accurate notch mark judgment may be impossible. Accordingly, a value that will not allow the elimination of data corresponding to, at least, points near the vertex of the notch mark should be selected for the first noise threshold value $m_1$.

A specific method that may be adopted when determining such a first noise threshold value $m_1$ is now explained. In the embodiment, the first noise threshold value $m_1$ is determined within a range over which the data corresponding to the vertex of the notch mark, at least, are not eliminated based upon the sampling data sampled in the area corresponding to the notch mark in the wafer edge shape data. More specifically, the first noise threshold value $m_1$ assumes a value selected from a range over which at least the data sampled at three sampling points, i.e., at the sampling point corresponding to the vertex of the notch mark, the immediately preceding sampling point and the immediately succeeding sampling point, in the sampling data corresponding to the notch mark area are not eliminated.

However, the sampling data sampled over the area corresponding to the notch mark indicate values that are fairly deviant relative to one another. For this reason, it is more desirable to set the first noise threshold value $m_1$ in a range over which the data sampled at five sampling points, i.e., at the sampling point corresponding to the vertex of the notch mark area, the two preceding sampling points and the two succeeding sampling points, in the sampling data sampled over the area corresponding to the notch mark are not eliminated, in order to ensure that the data sampled at the point corresponding to the vertex of the notch mark are not eliminated with greater reliability.

Figure 9:
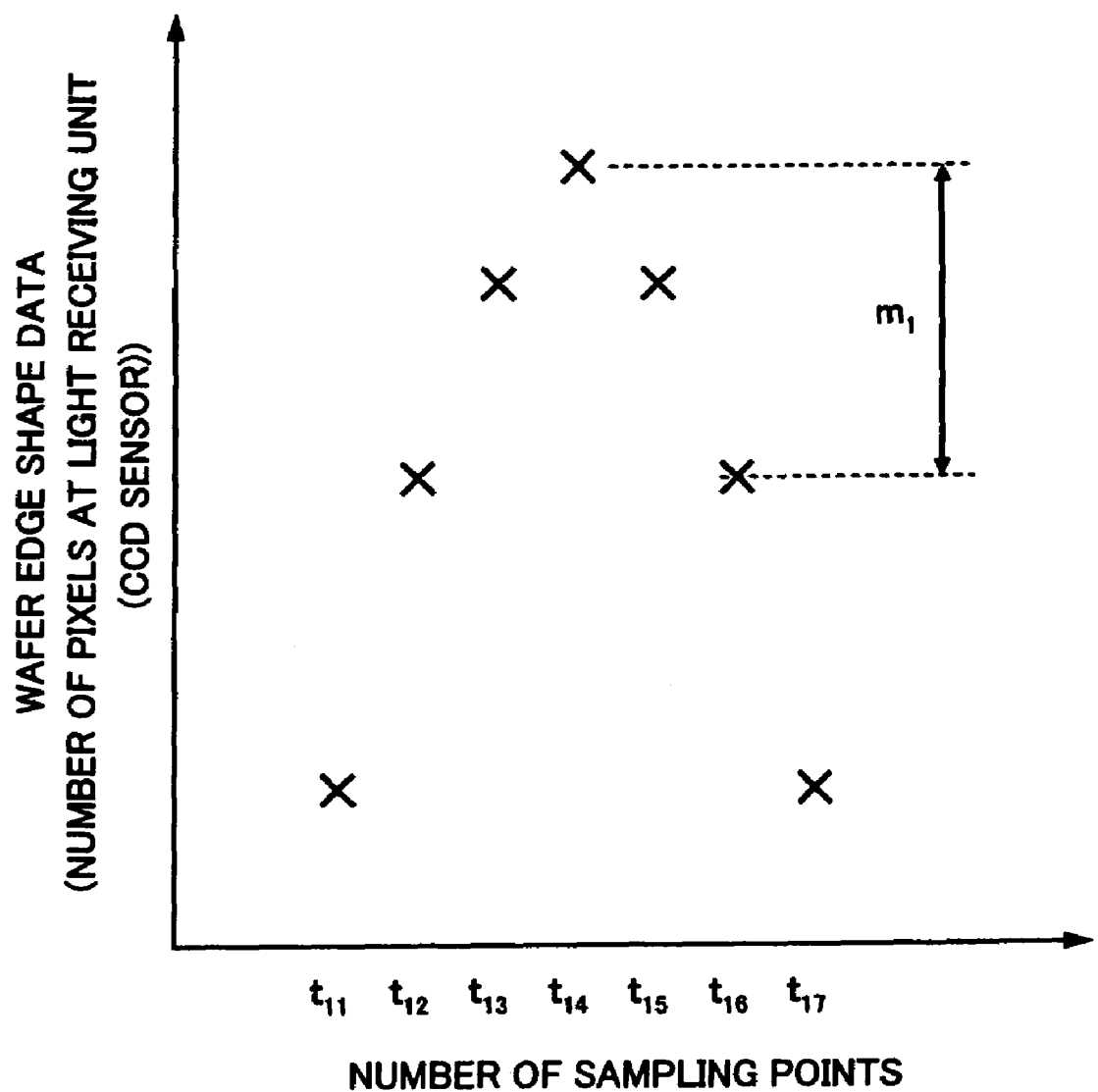
FIG. 9 shows the first noise threshold value used in the first noise reduction processing in FIG. 8.

In reference to FIG. 9 presenting a specific example of sampling data sampled over the area corresponding to the notch mark at the wafer W, the first noise threshold value $m_1$ is explained in further detail. The number of sampling points is indicated along the horizontal axis and the values indicated by the wafer edge shape data sampled at the individual sampling points, i.e., the numbers of pixels at the CCD sensor constituting the light receiving unit 240, are indicated along the vertical axis in FIG. 9. It is to be noted that the count value indicating the quantity of light received at the light receiving unit 240 may instead be indicated along the vertical axis. It is to be noted that the number of sampling points and the values indicated in the wafer edge shape data are also respectively indicated along the horizontal axis and the vertical axis in FIGS. 10 through 16 and FIGS. 22 through 26 in reference to which an explanation is to be given later. Instead of the number of pixels at the CCD sensor or the count value indicating the quantity of light received at the light receiving unit 240, the data obtained by converting the number of pixels at the CCD sensor or the count value indicating the received light quantity to a value indicating the distance (mm) between a reference position and the wafer edge instead may be used as the wafer edge shape data.

Using sampling data $t_{11}$ to $t_{17}$ sampled over the area corresponding to the notch mark at the wafer W shown in FIG. 9, the differences between the data $t_{14}$ sampled at the vertex sampling point corresponding to the vertex of the notch mark and the data $t_{12}$ sampled at the (vertex−2) sampling point and between the data $t_{14}$ and the data $t_{16}$ sampled at the (vertex+2) sampling point are calculated. Then, the value indicating a greater difference is selected for the first noise threshold value $m_1$. The first noise threshold value $m_1$ thus determined is pre-stored into a first noise threshold value storage area at the storage means constituted with the memory or the like at the control unit 180.

Through the first noise reduction processing executed as described above in the embodiment, abnormal data sampled at a given sampling point and indicating a markedly deviant value are eliminated and the wafer edge shape data are interpolated by using estimated data generated based upon surrounding data such as preceding and succeeding data. As a result, the abnormal data in a noise area where abnormal data manifest repeatedly to readily cause erroneous notch mark judgment are eliminated and such a noise area is no longer allowed to adversely affect the notch mark judgment. In addition, in the first noise reduction processing executed in the embodiment, data needed in the notch mark judgment, i.e., the data sampled over the area around the vertex of the notch mark, are not eliminated and are, therefore, retained.

Figure 10:
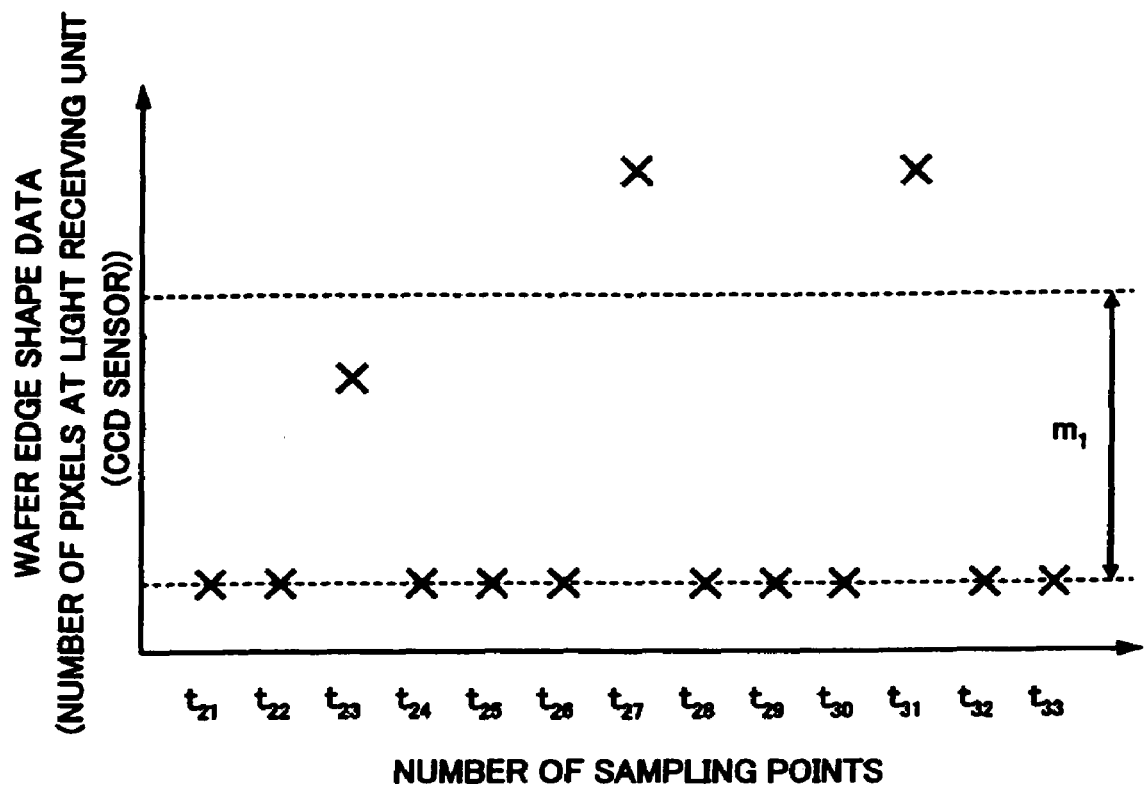
FIG. 10 presents a specific example of sampling data included in the wafer edge shape data.
Figure 11:
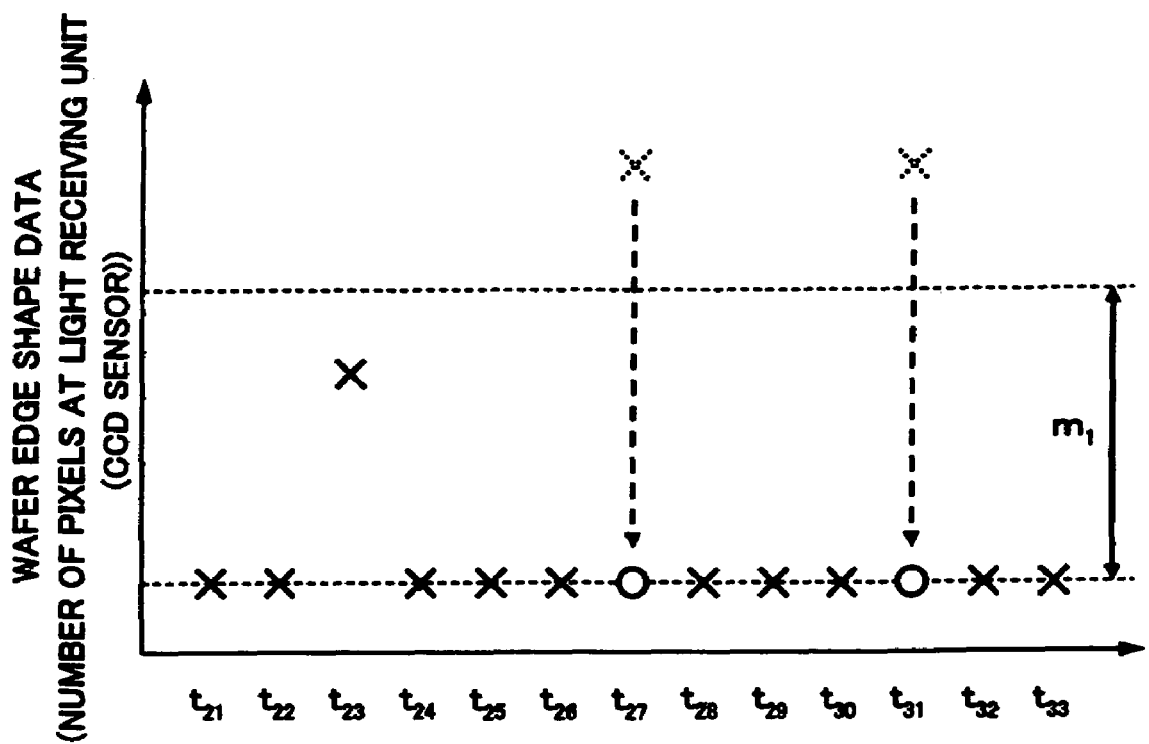
FIG. 11 shows the results obtained by executing the first noise reduction processing on the sampling data in FIG. 10.

For instance, assuming that the wafer edge shape data include sampling data $t_{21}$ through $t_{33}$ indicated by "X" in FIG. 10, the data $t_{27}$ and $t_{31}$ deviating from the surrounding data by extents equal to or greater than the first noise threshold value $m_1$ are judged to be abnormal data and are eliminated accordingly, whereas the data $t_{23}$ deviating by an extent less than the first noise threshold value $m_1$ are not judged to be abnormal data and are retained. Accordingly, the wafer edge shape data having undergone the first noise reduction processing are interpolated with estimated data indicated by "O" in FIG. 11 replacing the data $t_{27}$ and $t_{31}$ having been judged to be abnormal data, whereas the data $t_{23}$ having been judged not to be abnormal data are retained, as shown in FIG. 11.

In the first noise reduction processing, abnormal data sampled at a given sampling point and indicating a markedly deviant value are eliminated but abnormal data sampled at successive sampling points are retained. Only data with a markedly deviant value sampled at a given point are eliminated in order to simplify the calculation of estimated data to be used in the data interpolation. It is to be noted that any abnormal data sampled at successive sampling points that are retained in the wafer edge shape data do not present a problem since they are disqualified as a notch mark candidate through the notch mark judgment processing to be detailed later.

Next, the second noise reduction processing is explained. In the second noise reduction processing, noise data which are offset relative to the surrounding sampling data are corrected based upon the surrounding sampling data. As a result, the extent of deviance in the wafer edge shape data due to noise is reduced and thus, the noise does not adversely affect the notch mark judgment for the wafer W. It is to be noted that the second noise reduction processing is executed on the wafer edge shape processing data resulting from the first noise reduction processing.

The second noise reduction processing may be executed as follows. First, all the sets of wafer edge shape processing data are sequentially corrected, one set at a time. More specifically, data sampled at a specific sampling point are designated as target data, the largest data value and the smallest data value among the values indicated by the target data and the data sampled at the two preceding sampling points and the two succeeding sampling points are subtracted from the sum of the values indicated by the data sampled at the five sampling points and the value obtained by dividing the subtraction results by 3 is used as correction data. Then, the target data are replaced with the correction data.

Figure 12:
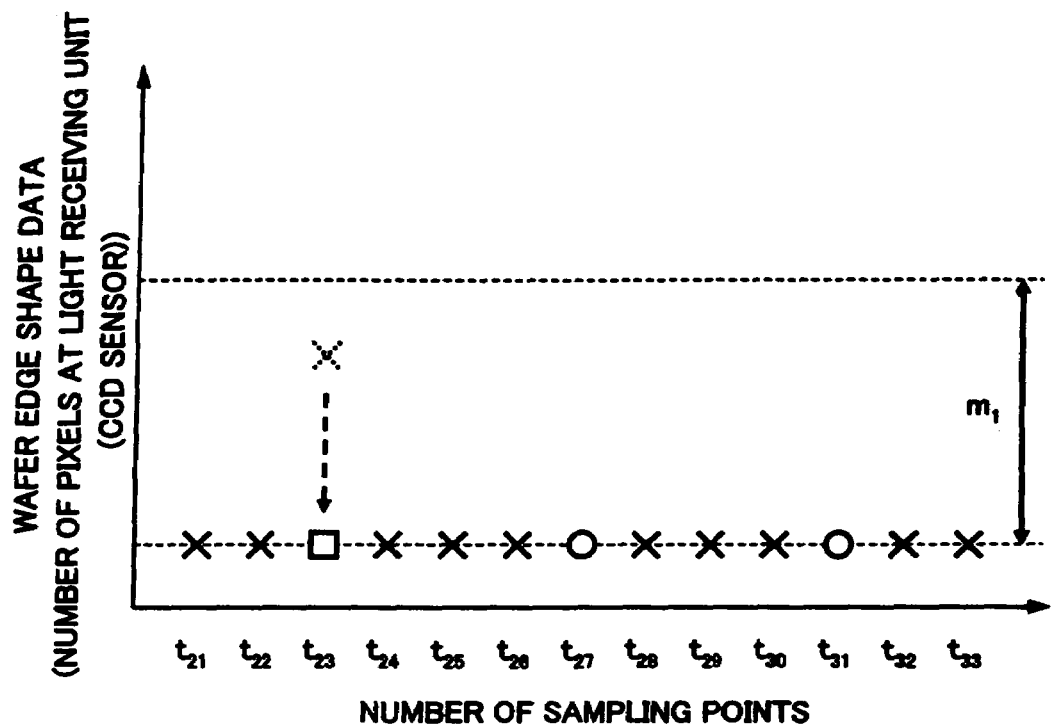
FIG. 12 shows the results obtained by executing the second noise reduction processing on the sampling data in FIG. 11.

Through the second noise reduction processing executed as described above in the embodiment, data indicating a lower value deviating from the surrounding sampling data as well as data indicating a higher value deviating from the surrounding sampling data are corrected. Data obtained by executing the second noise reduction processing on the sampling data in FIG. 11 having undergone the first noise reduction processing may be as shown in FIG. 12. FIG. 12 indicates that the data $t_{23}$ that have not been eliminated through the first noise reduction processing are corrected based upon the surrounding data, i.e., replaced with the correction data indicated by "☐". It is to be noted that the data indicated by "X" and "O" in FIG. 12 already indicate values consistent with those of the surrounding data and thus, the data remain unchanged even when they are replaced with the correction data.

In addition, by executing the second noise reduction processing after the first noise reduction processing, the likelihood of correcting saturated data (abnormal data remaining after the first noise reduction processing so as to reduce noise through the second noise reduction processing is raised. For instance, assuming that the wafer edge shape data initially contained a plurality of (5) sets of saturated data (abnormal data) and that a single set of saturated data among these saturated data remain after the first noise reduction processing, the retained saturated data can be corrected through the second noise reduction processing so as to reduce noise.

It is to be noted that while an explanation is given above in reference to the embodiment on an example in which the noise reduction processing is executed over two stages, i.e., the first noise reduction processing and the second noise reduction processing, the present invention is not limited to this example and the first noise reduction processing alone may be executed as the noise reduction processing. Namely, sudden abnormal data can be eliminated simply by executing the first noise reduction processing and thus, saturated data that may manifest readily when data are sampled from a transparent wafer can be effectively eliminated. However, by executing the first noise reduction processing and the second noise reduction processing in combination as in the embodiment, abnormal data can be eliminated to a greater extent than through the first noise reduction processing alone. As a result, noise attributable to abnormal data such as saturated data that may adversely affect the notch mark judgment for the wafer W can be more effectively reduced.

In addition, the second noise reduction processing alone may be executed as the noise reduction processing in conjunction with a nontransparent wafer, since problems attributable to saturated data which readily manifest when data are sampled from a transparent wafer, as described later, are not a concern. In the case of a transparent wafer however, a plurality of sets of saturated data are likely to manifest and, for this reason, if the second noise reduction processing alone is executed as the noise reduction processing on the actual wafer edge shape data, the saturated data may adversely affect the correction data calculated through the second noise reduction processing.

Figure 13:
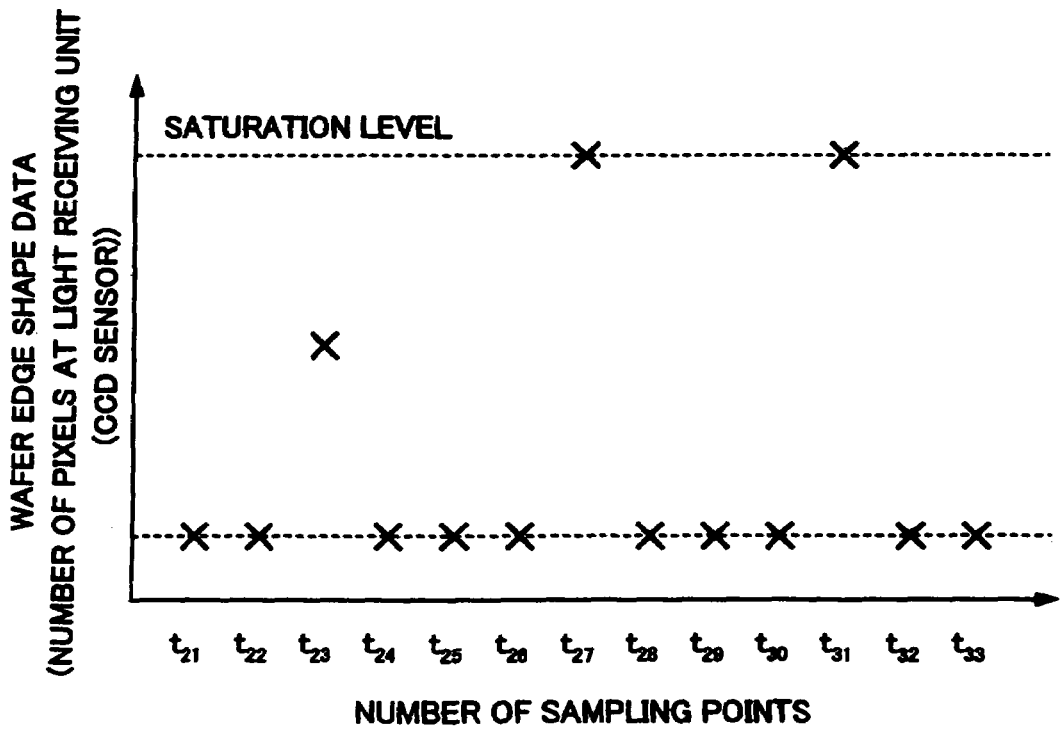
FIG. 13 presents a specific example of sampling data containing saturated data.
Figure 14:
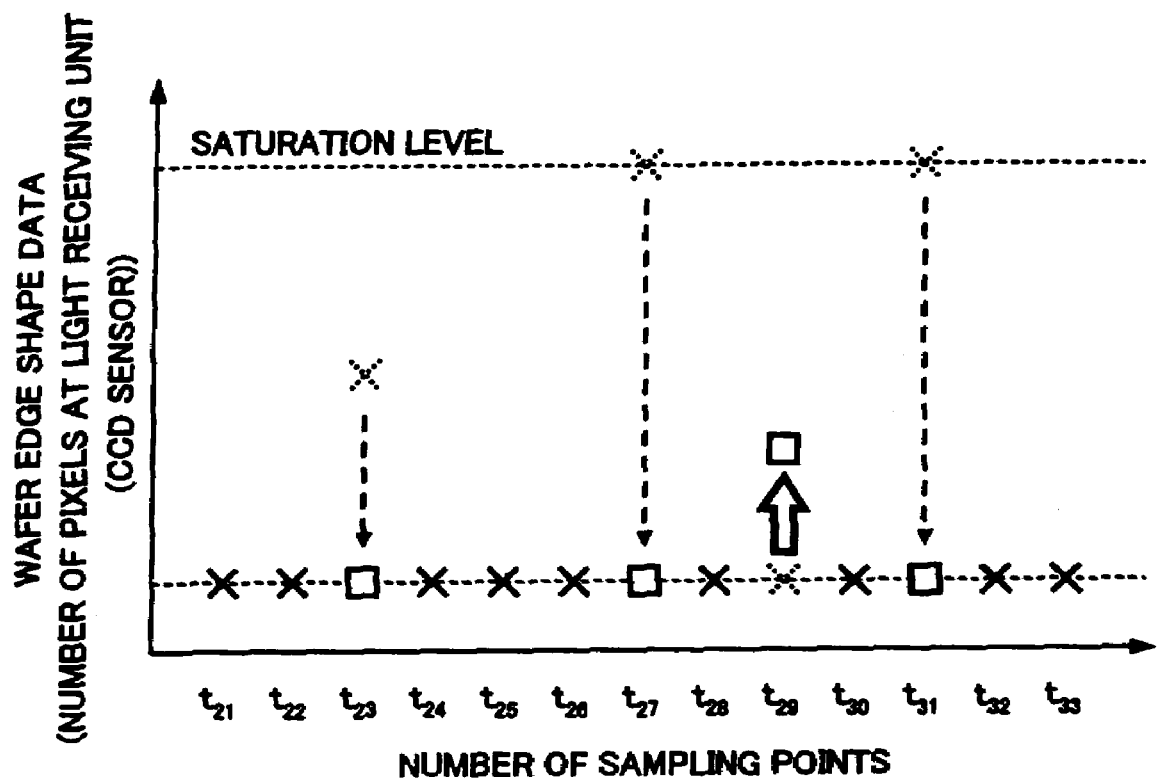
FIG. 14 shows the results obtained by executing only the second noise reduction processing on the sampling data in FIG. 13.

For instance, let us consider data generated by executing the second noise reduction processing alone on sampling data containing saturated data such as those shown in FIG. 13. As long as only one set of saturated data is included in five sets of sampling data sampled at five successive sampling points (e.g., when the data are $t_{23}$, $t_{27}$ or $t_{31}$) the discrete saturated data are corrected to indicate the value matching the value of the surrounding data, as shown in FIG. 14, and thus, no problem occurs. If, on the other hand, two sets of saturated data are included in five sets of sampling data sampled at five successive sampling points (e.g., when the data $t_{29}$ are the target data), the value obtained by subtracting the largest data value and the smallest data value from the sum of the values indicated at the five successive sampling points will contain the value indicated by the saturated data sampled at one sampling point. As a result, the correction data for the target data $t_{29}$ will be affected by the retained saturated data, increasing the value indicated by the corrected data as shown in FIG. 14. This means that if the second noise reduction processing alone is executed, normal data may become erroneously corrected to increase noise while, at the same time, abnormal data are corrected so as to reduce noise.

Figure 15:
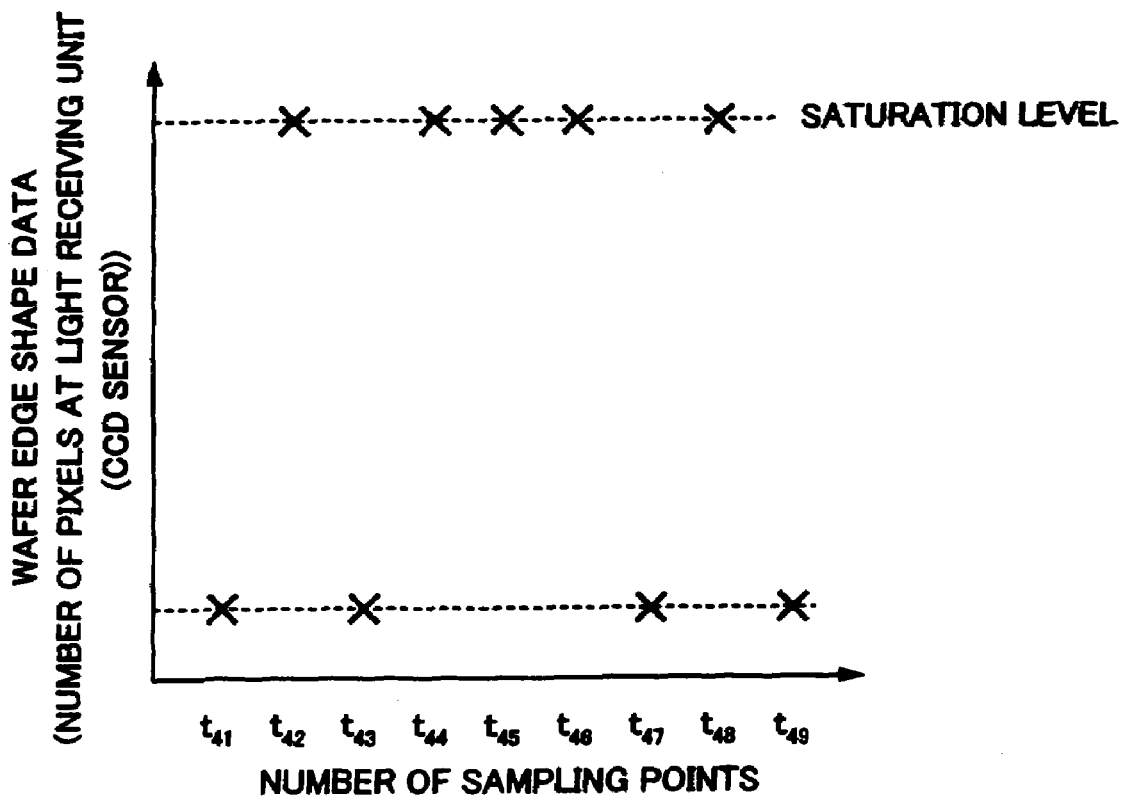
FIG. 15 presents a specific example of sampling data over a noise area, which contain a plurality of sets of saturated data.
Figure 16:
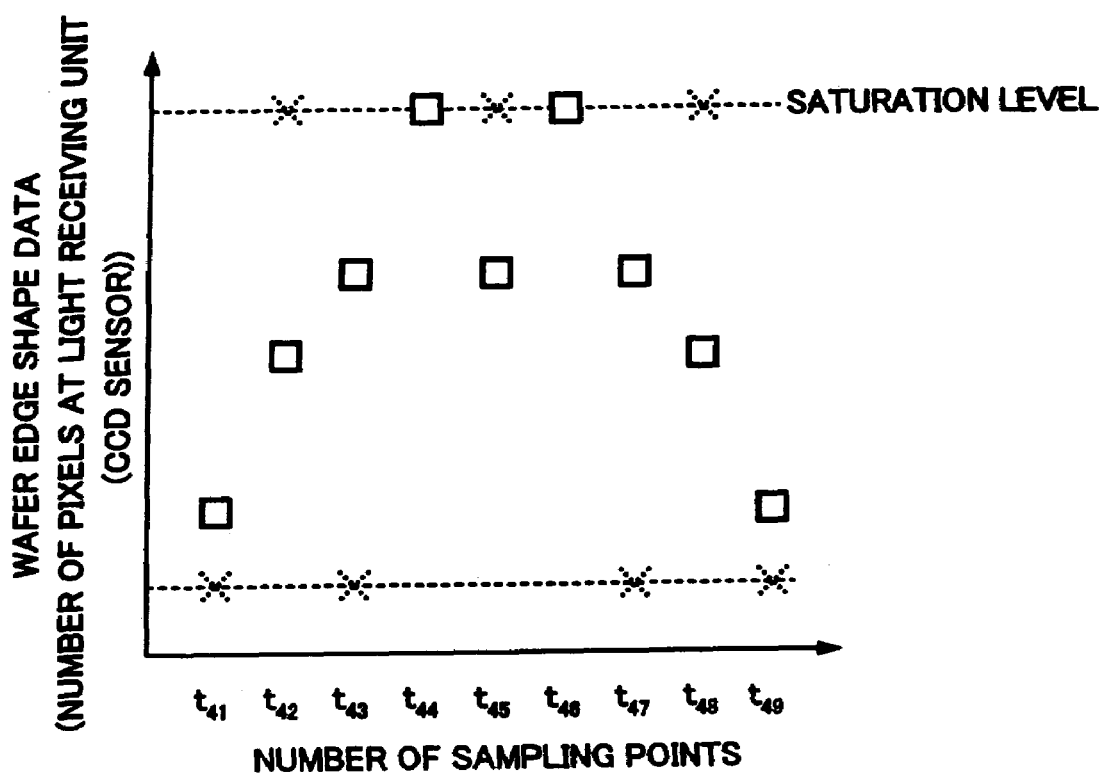
FIG. 16 shows the results obtained by executing only the second noise reduction processing on the sampling data in FIG. 15.

Thus, depending upon how saturated data are distributed (e.g., sudden saturated data repeatedly manifesting as in the area C in FIG. 6), the data over the noise area may be corrected to indicate values close to those indicated by the data corresponding to the notch mark through the second noise reduction processing. For instance, if the second noise reduction processing alone is executed on sampling data sampled over a noise area and containing a plurality of sets of saturated data, as shown in FIG. 15, the corrected data over the noise area may become similar to those corresponding to the notch mark, as shown in FIG. 16. In such a case, the noise area may be erroneously judged to be the notch mark at the wafer W.

Accordingly, it is particularly desirable to execute the first noise reduction processing prior to the second noise reduction processing in conjunction with a transparent wafer W. Since sudden saturated data are eliminated through the first noise reduction processing, the extent to which the second noise reduction processing is affected by saturated data can be minimized. In other words, since no noise area is allowed to be corrected through the second noise reduction processing to become data similar to those of the notch mark, a noise area is not erroneously judged to be the notch mark at the wafer W in the notch mark judgment to be explained later. As a result, the notch mark judgment accuracy is improved.

It is to be noted that similar problems to those inherent to a transparent wafer W may also occur with regard to a nontransparent wafer W, if abnormal data attributable to electrical noise or the like occurring in, for instance, the signal control manifest. For this reason, the first noise reduction processing may be executed prior to the second noise reduction processing in conjunction with a nontransparent wafer W as well. In short, the same noise reduction processing may be executed regardless of the wafer type, i.e., whether data are being sampled from a transparent wafer W or a nontransparent wafer W.

(Notch Mark Detection Processing)

Figure 17:
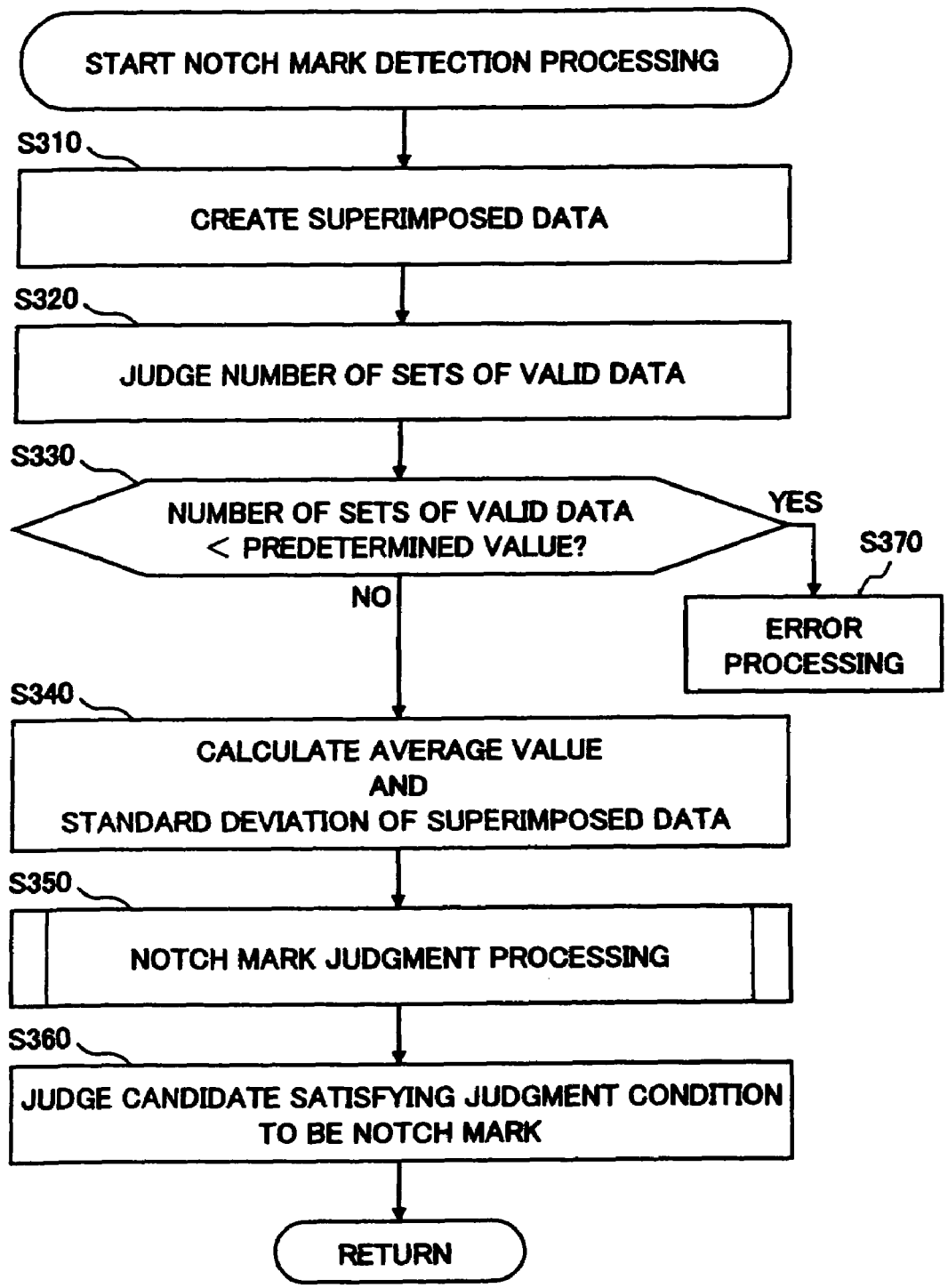
FIG. 17 presents a flowchart of a specific example of the notch mark detection processing in FIG. 7.

Once the noise reduction processing described above ends, the operation returns to the main routine in FIG. 7 in which notch mark detection processing is executed in step S300. The notch mark detection processing is executed on the wafer edge shape data (processing data) having undergone the noise reduction processing. FIG. 17 shows a specific example of the notch mark detection processing.

Figure 18:
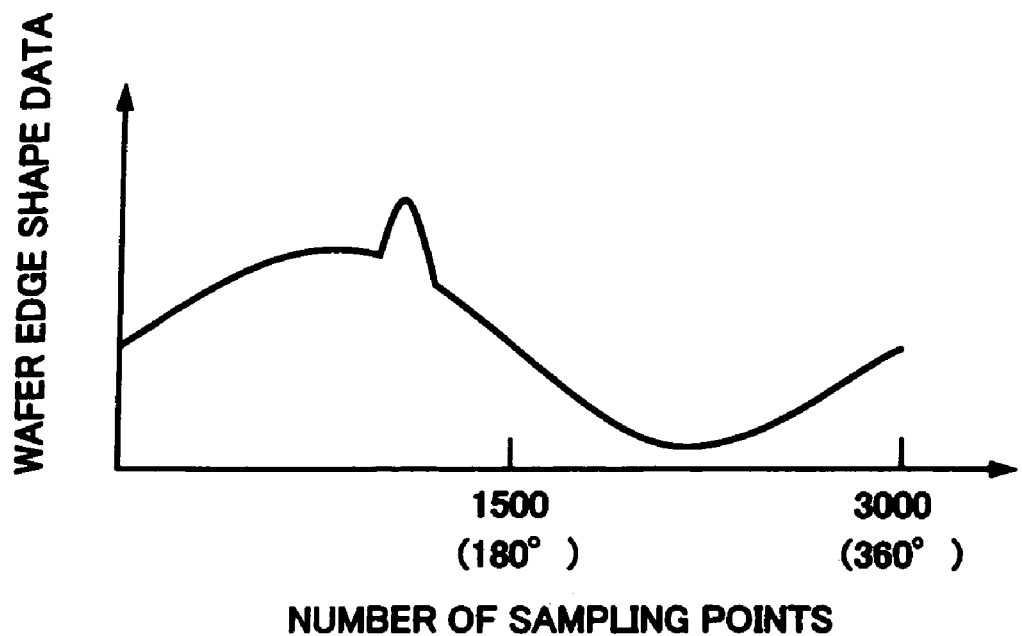
FIG. 18 presents a specific example of sampling data corresponding to a full cycle in the wafer edge shape data.
Figure 19:
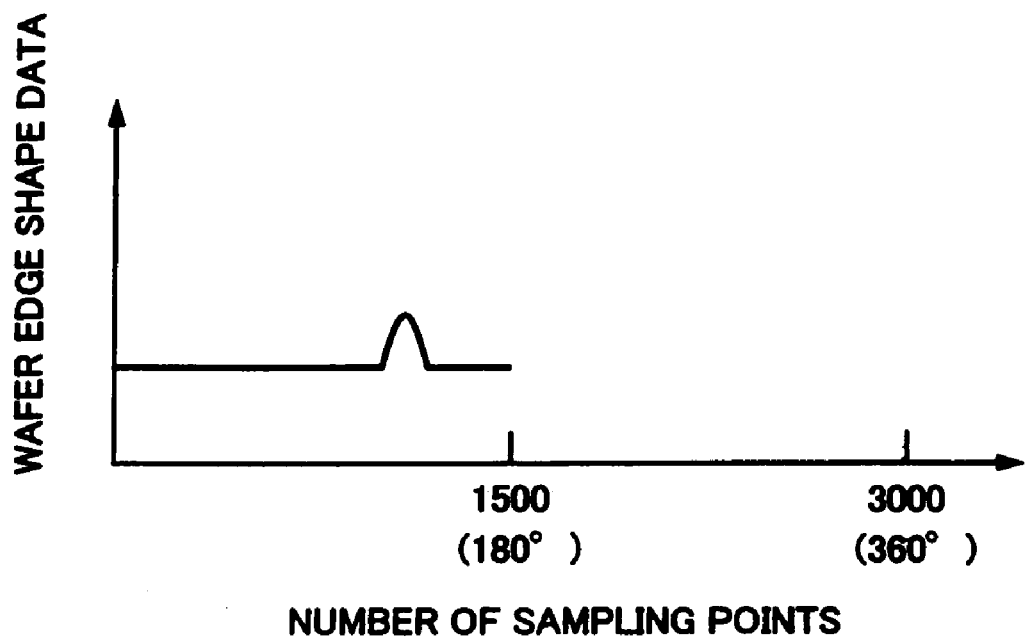
FIG. 19 shows superimposed data generated based upon the wafer edge shape data in FIG. 18.

In step S310 in FIG. 17, superimposed data are prepared. More specifically, sampling data corresponding to half a cycle (180°) in the wafer edge shape data are offset and superimposed over the sampling data taken over the other half cycle. For instance, by offsetting and superimposing sampling data taken over half a cycle (180°) in the wafer edge shape data in FIG. 18 over the sampling data taken over the other half cycle, the superimposed data shown in FIG. 19 are obtained. FIGS. 18 and 19 represent an example in which sampling data are taken at 3000 sampling points in correspondence to a single rotation of the wafer. Accordingly, the values 0 through 3000 taken along the horizontal direction correspond to rotational angles 0° through 360° of the wafer W.

Next, a decision is made with regard to the ratio of the number of sets of valid data in step S320. The term "valid data" in this context refers to data within a range over which data can be detected by the sensor unit 220 along the radial direction of the wafer, and data outside the detectable range are determined to be invalid. For instance, if the center of the wafer W and the rotational center at the rotary stage 210 are offset from each other to a significant extent, the wafer circumferential edge may not be entirely contained in the detectable range over which the wafer edge can be detected along the radial direction by the sensor unit 220. As a result, the sensor unit may not be able to detect the wafer edge and the wafer edge shape data may contain successive sets of invalid data (may be saturated data in the case of a transparent wafer W through which the light from the light-transmitting sensor 250 is transmitted). If the ratio of the number of sets of valid data to the total number of sets of wafer edge shape data having been sampled is low, the wafer edge shape cannot be accurately detected and ultimately, the notch mark judgment cannot be executed accurately for the wafer W. For this reason, the ratio of the number of valid data to all the total number of sets of wafer edge shape data having been sampled is determined.

Next, a decision is made in step S330 as to whether or not the number of sets of valid data is less than a predetermined value. More specifically, a decision may be made, for instance, as to whether or not the number of sets of valid data is less than $3/10$ of the sets of sampling data sampled while the wafer rotates once (360°) in the wafer edge shape data. This decision may be made by using superimposed data such as those shown in FIG. 19 and making a decision as to whether or not the number of sets of valid data is less than $3/5$ of the number of sets of sampling data sampled over a half rotation (180°). It is to be noted that the criterion to be adopted in the valid data judgment is not limited to that described above, and any numerical value may be set in correspondence to the required level of accuracy.

If it is decided in step S330 that the number of sets of valid data is less than the predetermined value, error processing is executed in step S370. In the error processing, a message indicating that effective alignment processing cannot be executed is displayed at a display means such as a display unit and the wafer W is repositioned on the rotary stage 210 via the common transfer mechanism 160.

If it is decided in step S330 that the number of sets of valid data is equal to or greater than the predetermined value, the average value among the values indicated by the superimposed data obtained from the wafer edge shape data and a standard deviation (δ) of the superimposed data are calculated. The average value and the standard deviation (δ) may be calculated by excluding data over a specific range (the area corresponding to the notch mark) containing the position, at which the peak value (the largest value) has been sampled, from the valid data. By calculating the average value and the standard deviation (δ) without the data over the area corresponding to the notch mark and the invalid data, highly accurate average value and standard deviation (δ) can be obtained. It is to be noted that the average value and the standard deviation (δ) of the superimposed data obtained from the wafer edge shape data, having been calculated as described above, are stored into the memory or the like at the control unit 180.

(Notch Mark Judgment Processing)

Figure 20:
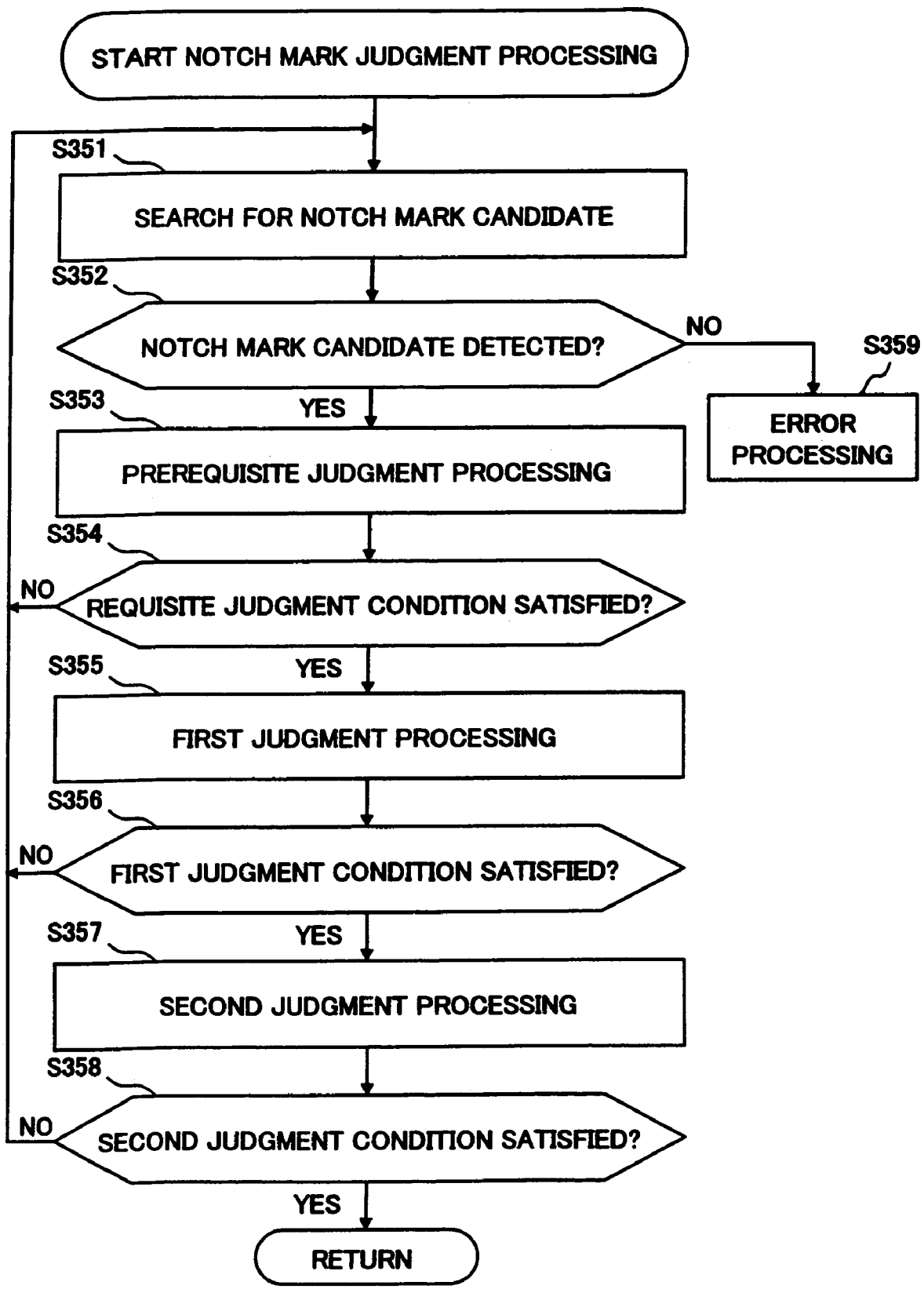
FIG. 20 presents a flowchart of a specific example of the notch mark judgment processing in FIG. 17.

Next, notch mark judgment processing is executed in step S350. FIG. 20, presents a flowchart of a specific example of the notch mark judgment processing. As shown in FIG. 20, the notch mark judgment processing is executed by first searching for a notch mark candidate in the superimposed data generated based upon the wafer edge shape data in step S351.

Figure 21:
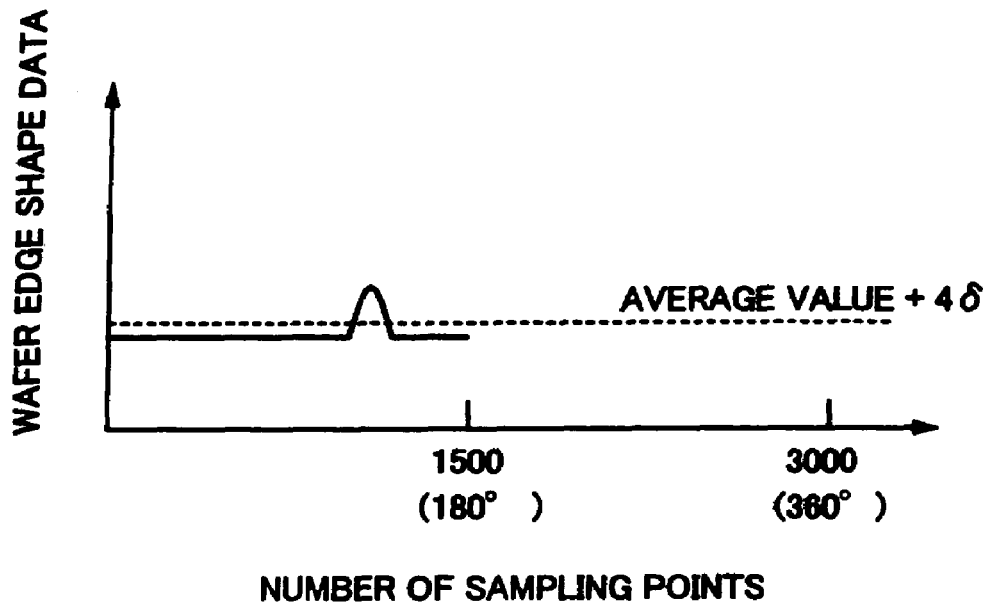
FIG. 21 illustrates the notch mark candidate search in FIG. 17.

More specifically, a notch mark candidate is searched based upon the average value and the standard deviation (δ) of the superimposed data generated based upon the wafer edge shape data as described earlier. For instance, the sum of the average value of the superimposed data and 4δ may be designated as a threshold value, data with a value exceeding the threshold value may be searched for in the superimposed data and such data may be judged to represent a notch mark candidate, as shown in FIG. 21.

Next, in step S352, a decision is made as to whether or not a notch mark candidate has been detected through the search. If it is decided that no notch mark candidate has been detected through the search, error processing is executed in step S359. In the error processing, a message indicating that effective alignment processing cannot be executed is displayed at the display means such as display unit, and the wafer W is repositioned on the rotary stage 210 via the common transfer mechanism 160.

If it is decided in step S352 that a notch mark candidate has been detected through the search, prerequisite judgment processing is executed in step S353 on the sampling data corresponding to the detected notch mark candidate. The decision with regard to a prerequisite judgment condition is made in this embodiment so as to ensure that the subsequent main judgment (e.g., first judgment processing and second judgment processing) for the notch mark candidate can be executed accurately.

The prerequisite judgment condition may be that the number of sets of sampling data corresponding to the notch mark candidate be equal to or greater than a predetermined value (e.g., 3), since the sampling data cannot be curvilinearly approximated in the main judgment (e.g., the first judgment processing and the second judgment processing) unless there are at least three sets of sampling data corresponding to the notch mark candidate.

Another prerequisite judgment condition that may be considered is that the number of sets of saturated data contained in the sampling data corresponding to the notch mark candidate is less than a predetermined value (e.g., 20), so as not to execute the first judgment processing (step S355) or the second judgment processing (step S357), if there are 20 or more sets of saturated data contained in the sampling data corresponding to the notch mark candidate and thus the notch mark candidate is highly likely to be a noise area. Through such prerequisite judgment processing, an erroneous notch mark judgment attributable to saturated data is preempted.

Figure 22:
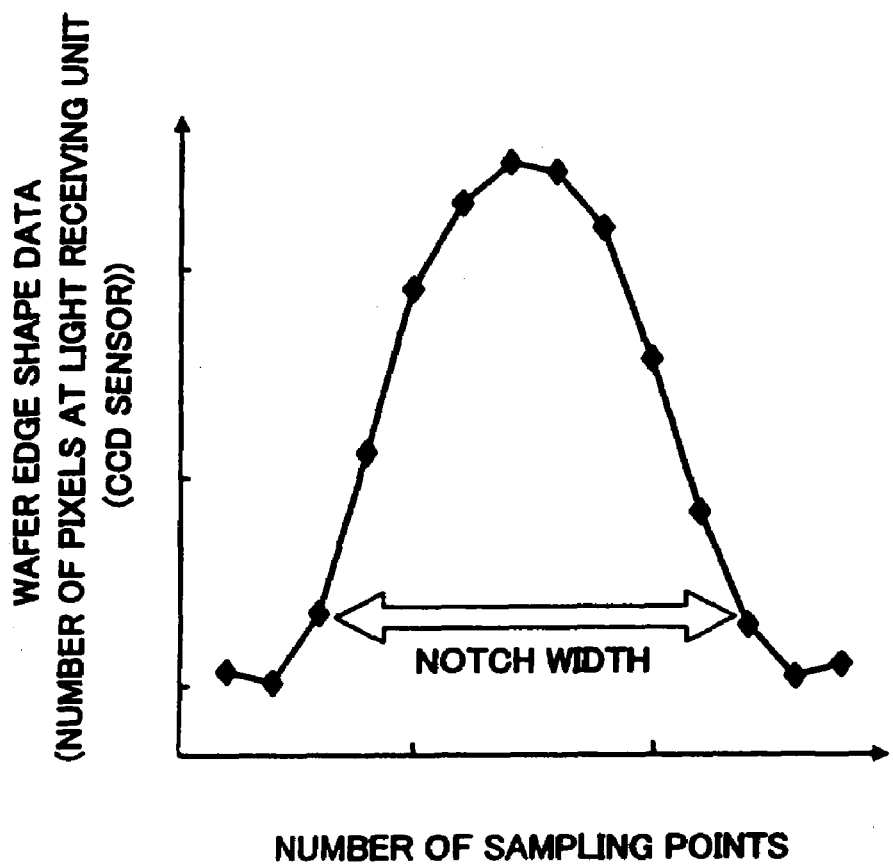
FIG. 22 presents a specific example of a notch mark candidate.

Yet another prerequisite judgment condition that may be considered is that the number of sets of sampling data corresponding to the notch mark candidate is within an allowable range (e.g., a reference value 9±4 if the notch mark is constituted with a notch) within which the sampling data can conceivably represent the notch mark. FIG. 22 presents a specific example of a notch mark candidate that may be detected when the notch mark is formed with a notch. When the notch mark is constituted as a notch, a specific notch width is indicated by the sampling data corresponding to a notch mark candidate, the number of sets of which is within the allowable range, and such a notch mark candidate is highly likely to be the actual notch mark.

It is to be noted that the prerequisite judgment processing may be executed based upon any one of the prerequisite judgment conditions described above or it may be executed by using any two of the prerequisite judgment conditions in combination. However, it is most desirable to execute the prerequisite judgment processing based upon all the prerequisite judgment conditions described above in order to execute the subsequent notch mark main judgment with higher accuracy.

In step S354, a decision is made as to whether or not the sampling data corresponding to the detected notch mark candidate satisfy the prerequisite judgment conditions described above. If it is decided in step S354 that the sampling data do not satisfy the prerequisite judgment conditions, the operation returns to step S351 to search for another notch mark candidate. If no other notch mark candidate is detected, error processing is executed, whereas if another notch mark candidate is detected through the search, the prerequisite judgment processing is executed again for the new notch mark candidate.

If, on the other hand, it is decided in step S354 that the sampling data satisfy the prerequisite judgment conditions, the main judgment is executed in step S355 and subsequent steps. As shown in FIG. 20, the notch mark main judgment is executed over two stages in the embodiment, i.e., first judgment processing (step S355) and second judgment processing (step S357) executed after the first judgment processing.

(First Notch Mark Judgment Processing)

First, the first judgment processing (step S355) is explained. In the first judgment processing, the sets of sampling data corresponding to the detected notch mark candidate (hereafter may be referred to as "data group for the notch mark candidate") are curvilinearly approximated and an error (offset) manifesting between the approximate curve and the data group for the notch mark candidate is judged.

The first judgment processing may be executed as follows. First, quadratic curvilinear (parabolic) approximation processing is executed on the data group for the detected notch mark candidate through, for instance, the method of least squares. Such quadratic curvilinear (parabolic) approximation processing may be executed by, for instance, curvilinearly approximating the sampling data $(x_i, y_i)$, corresponding to the notch mark candidate and having been sampled at N sampling points, through the method of least squares, as expressed in the quadratic expression in (2-1) below.

$$y = a_0 + a_1 x + a_2 x^2 \qquad (2\text{-}1)$$

Through the method of least squares, the values for $a_0$, $a_1$ and $a_2$ are determined so as to achieve a minimal value in expression (2-2) below.

$$S = (y_1 - y)^2 + (y_2 - y)^2 + \ldots + (y_n - y)^2 =$$
$$(y_1 - a_0 - a_1 x_1 - a_2 x_1^2)^2 +$$
$$(y_2 - a_0 - a_1 x_2 - a_2 x_2^2)^2 \ldots + (y_n - a_0 - a_1 x_n - a_2 x_n^2)^2 \qquad (2\text{-}2)$$

Since the values obtained by differentiating S expressed as in (2-2) above individually with $a_0$, $a_1$ and $a_2$ are invariably 0 at a minimal point, $a_0$, $a_1$ and $a_2$ that will achieve a minimal value for Sin expression (2-2) can be determined, and then, a curvilinear approximation expression can be determined as expressed in (2-1).

Once the approximate curve approximating the data group for the notch mark candidate is determined, the error manifesting between the approximate curve and the data group for the notch mark candidate is ascertained. For instance, approximate values are calculated based upon the curvilinear approximation expression obtained through the method of least squares, as described above, each in correspondence to one of the sampling points at which the sampling data in the data group corresponding to the notch mark candidate have been sampled.

Figure 23:
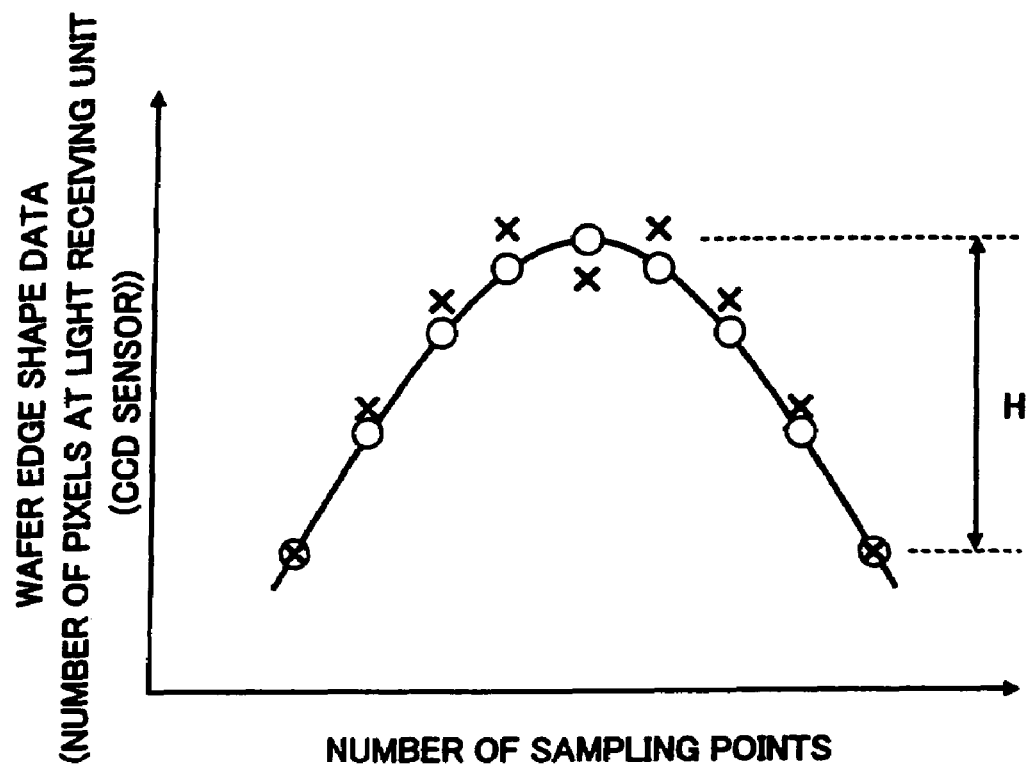
FIG. 23 presents a specific example of a notch mark candidate.

Next, the error manifesting between the approximate value data group obtained as indicated in the curvilinear approximation expression and the initial data group for the notch mark candidate is ascertained. More specifically, values each indicating the difference between the data at a given point in the approximate value data group obtained as indicated in the curvilinear approximation expression and the data at the corresponding sampling point in the initial data group for the notch mark candidate are calculated, and the average of these values is calculated as the error between the approximate curve and the initial data group. FIG. 23 presents a specific example of the approximate value data group obtained as indicated in the curvilinear approximation expression and the initial data group for the notch mark candidate. The solid curve in FIG. 23 is the approximate curve, with "X" indicating data in the initial data group for the notch mark candidate and "O" indicating data in the approximate value data group obtained as indicated in the curvilinear approximation expression.

Then, a decision is made as to whether or not the error manifesting relative to the approximate curve thus obtained satisfies a first judgment condition (error judgment). The first judgment condition based upon which the error judgment is executed may be that the ratio of the error relative to the depth (height) H of the notch mark candidate indicated by the approximate curve, as shown in FIG. 23, does not exceed a first judgment threshold value.

The depth (height) H of the notch mark candidate area indicated by the approximate curve, as described above, may be calculated as the difference between the largest value and the smallest value among the approximate values calculated as indicated in the curvilinear approximation expression. In other words, the first judgment condition may be that the ratio of the error manifesting between the approximate value data obtained as indicated in the curvilinear approximation expression and the sampling data corresponding to the notch mark candidate, to the difference between the largest value and the smallest value among the approximate values calculated as indicated in the curvilinear approximation expression does not exceed the first judgment threshold value (e.g., $1/10$).

In the embodiment, the depth (height) H (e.g., the difference between the largest value and the smallest value among the approximate values calculated as indicated in the curvilinear approximation expression) of the notch mark candidate indicated by the approximate curve is used as the reference in the error judgment for the following reason.

Figure 24:
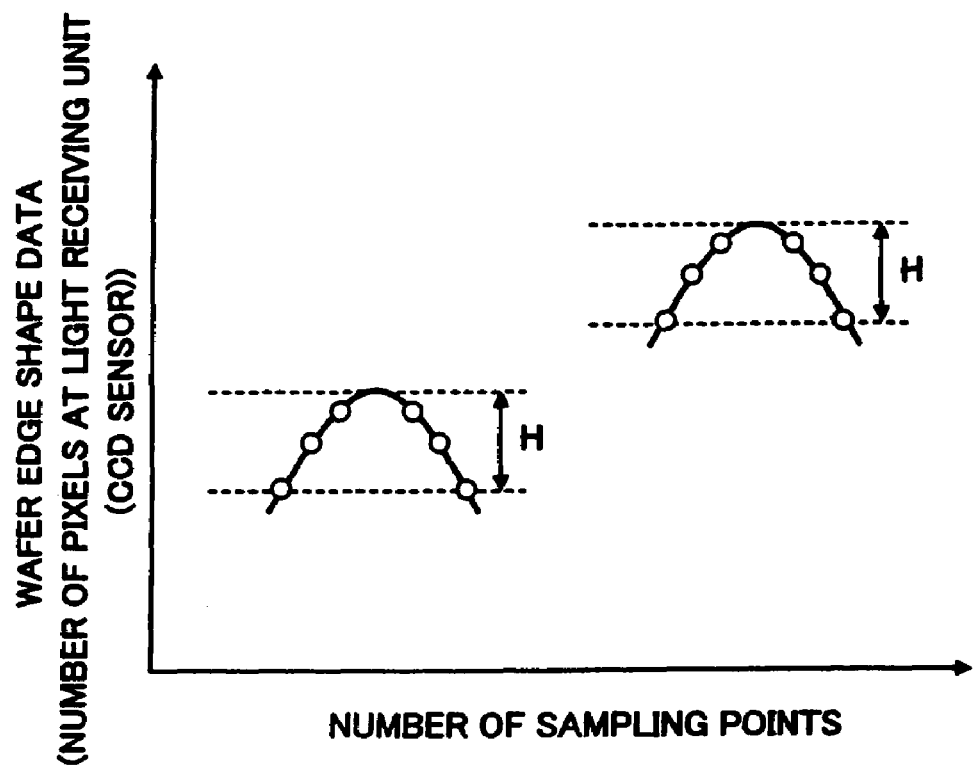
FIG. 24 illustrates rise (shift) of the wave form of the superimposed data.

Prior to the notch mark candidate judgment, the sinewave component in the wafer edge shape data is canceled by folding back the sampling data corresponding to the half cycle in the wafer edge shape data and thus creating superimposed data (step S310 in FIG. 17). The resulting data indicate a substantially flat waveform except for the area corresponding to the notch mark (see, for instance, FIG. 21). However, if the wafer edge shape data contain saturated data, the waveform in the superimposed data may become raised (shifted) over the saturated area. For this reason, the notch mark candidate in the superimposed data may become shifted or may remain not shifted, depending upon the presence/absence of saturated data, as shown in FIG. 24, resulting in fluctuation of the values indicated by the superimposed data over the notch mark candidate area. For this reason, if approximate values calculated as indicated in the curvilinear approximation expression are directly used as a reference in the error judgment, the error judgment will be affected by any fluctuation of the data values in the notch mark candidate area.

Accordingly, instead of directly using the approximate values calculated as indicated in the curvilinear approximation expression as a reference in the error judgment, the depth (height) H of the notch mark candidate area indicated by the approximate curve, as shown in FIG. 24, is used as the reference in the error judgment in the embodiment so as to ensure that the error judgment can be executed without being affected by any fluctuation of the values indicated in the superimposed data over the notch mark candidate area.

It is desirable to select a value that will allow the data corresponding to the actual notch mark to be retained and will eliminate the data corresponding to a noise area detected as a notch mark candidate, for the first judgment threshold value. For instance, the results of error judgment tests executed to ascertain the extents of error is manifesting over the notch mark area and a noise area in data sampled from the wafer edge shape data indicate that while the extent of error manifesting over the notch mark area is equal to or less than $1/40$ of the depth (height) H of the notch mark candidate area, the extent of error manifesting over the noise area is equal to or greater than $7/10$ of the depth (height) H of the notch mark candidate area. This means that the first judgment threshold value should be, at least, within the range of $1/40$ to $7/10$ of the depth (height) H of the notch mark candidate area. Since the extent of error manifesting over the notch mark area is equal to or less than $1/40$ of the depth (height) H of the notch mark candidate area, it is even more desirable to set the first judgment threshold value to $1/10$ of the depth (height) H of the notch mark candidate area by allowing for a comfortable margin. The first judgment threshold value thus determined should be pre-stored into a first judgment threshold value storage area at the storage means constituted with the memory or the like at the control unit 180.

Through the first judgment processing described above, a notch mark candidate manifesting a greater error relative to the approximate curve, which is likely to be a noise area, is disqualified as a notch mark candidate. In addition, if the error between the notch mark candidate and the approximate curve is less than the first judgment threshold value, the notch mark candidate area is more likely to be the actual notch mark. Thus, by judging whether or not a notch mark candidate is the actual notch mark through the first judgment processing described above, the judgment accuracy is improved. In addition, since any noise areas detected as notch mark candidates are eliminated before the second judgment processing, the risk of erroneously judging a noise area to be the notch mark in the second judgment processing is eliminated.

The first judgment processing described above is executed in step S355, and in step S356, a decision is made as to whether or not the error manifesting between the sampling data corresponding to the notch mark candidate and the approximate curve satisfies the first judgment condition through the error judgment in the first judgment processing.

If it is decided in step S356 that the error does not satisfy the first judgment condition, the operation returns to step S351 to search for another notch mark candidate, whereas the second judgment processing is executed in step S357 if the error is judged to satisfy the first judgment condition.

(Second Notch Mark Judgment Processing)

The second judgment processing (step S357) is now explained. In the second judgment processing, a decision is made as to whether or not a coefficient in the curvilinear approximation expression, representing the curvilinear approximation of the sampling data corresponding to the notch mark candidate, satisfies a second judgment condition. Through this judgment processing, it can be determined whether or not the shape of the approximate curve corresponding to the notch mark candidate is close to the shape of the actual notch mark (e.g., the shape of an approximate curve obtained by curvilinearly approximating the sampling data for the actual notch mark).

The second judgment processing may be executed as follows. If a quadratic curvilinear (parabolic) approximation processing has been executed on the sampling data for the detected notch mark candidate through, for instance, the method of least squares, a decision is made as to whether or not the coefficient $a_2$ of the quadratic term in the quadratic curvilinear expression in (2-1) is within an allowable range set as the second judgment condition.

It is desirable to set the allowable range to constitute the second judgment condition in correspondence to the actual shape of the notch mark formed at the wafer W, since the shape of the curve obtained by curvilinearly approximating the data over the area of the notch mark changes depending upon the shape of the notch mark at the wafer W. The allowable range constituting the second judgment condition may be set to, for instance, a reference value 30±18 if the notch mark is an actual notch. The allowable range set as the second judgment condition as explained above is pre-stored into an allowable range area at the storage means constituted with the memory or the like at the control unit 180.

Since a notch mark candidate with an approximate curve closer in shape to the approximate curve of the actual notch mark is more likely to be the actual notch mark, the notch mark judgment is executed with greater accuracy through the second judgment processing.

In addition, since the second judgment processing is executed to determine whether or not the shape of the approximate curve corresponding to the notch mark candidate is close to the shape of the approximate curve for the actual notch mark after ascertaining the extent of error manifesting between the approximate curve obtained by curvilinearly approximating the notch mark candidate and the sampling data corresponding to the notch mark candidate through the first judgment processing, the accuracy of the notch mark judgment is further improved.

It is to be noted that while an explanation is given in reference to the embodiment on an example in which the main notch mark judgment is executed over two stages, i.e., the first judgment processing and the second judgment processing, the present invention is not limited to this example and the first judgment processing alone may be executed as the main notch mark judgment. Namely, the first judgment processing alone may be executed as the main notch mark judgment to ensure that a noise area over which deviant abnormal data such as saturated data manifest is not erroneously judged to be the notch mark and thus, the accuracy of the notch mark judgment can be improved.

In addition, the second judgment processing alone may be executed as the main notch mark judgment in conjunction with a nontransparent wafer since problems attributable to saturated data which readily manifest when data are sampled from a transparent wafer, as described later, are not a concern.

In the case of a transparent wafer however, a plurality of sets of saturated data are likely to manifest and, for this reason, if the second judgment processing alone is executed as the main notch mark judgment, a noise area may be erroneously judged to be the notch mark, depending upon how the saturated data are distributed.

Figure 25:
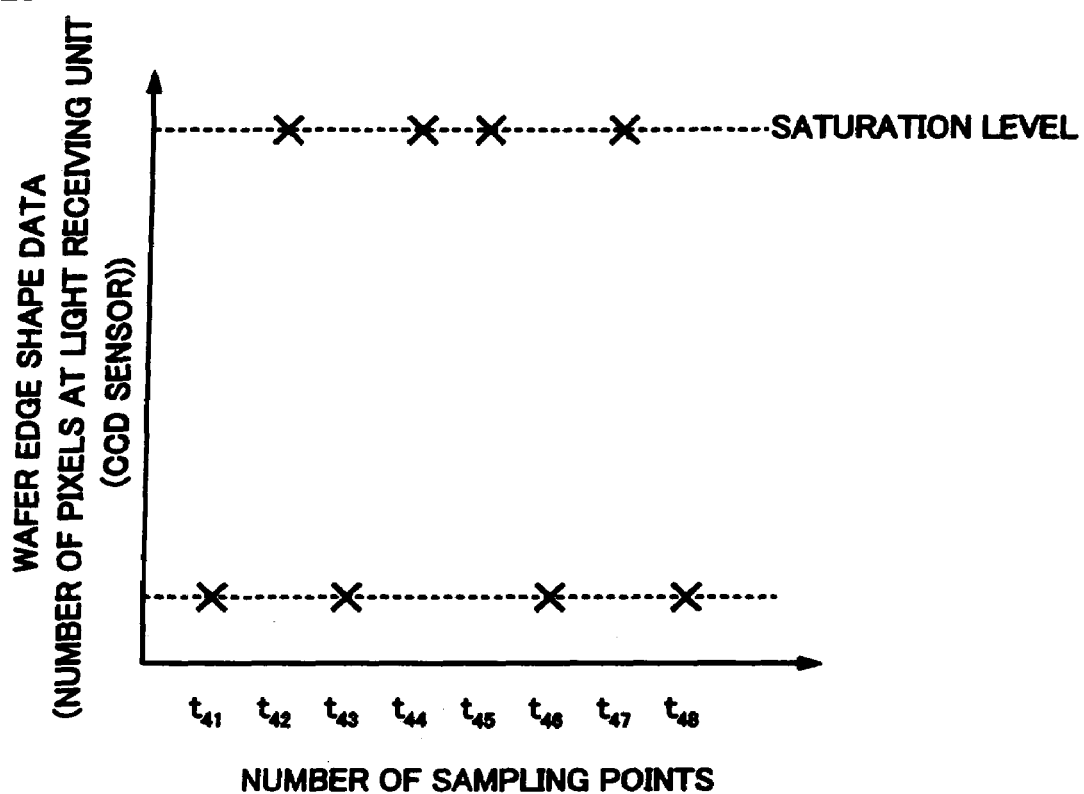
FIG. 25 presents another specific example of sampling data over a noise area, which contain a plurality of sets of saturated data.
Figure 26:
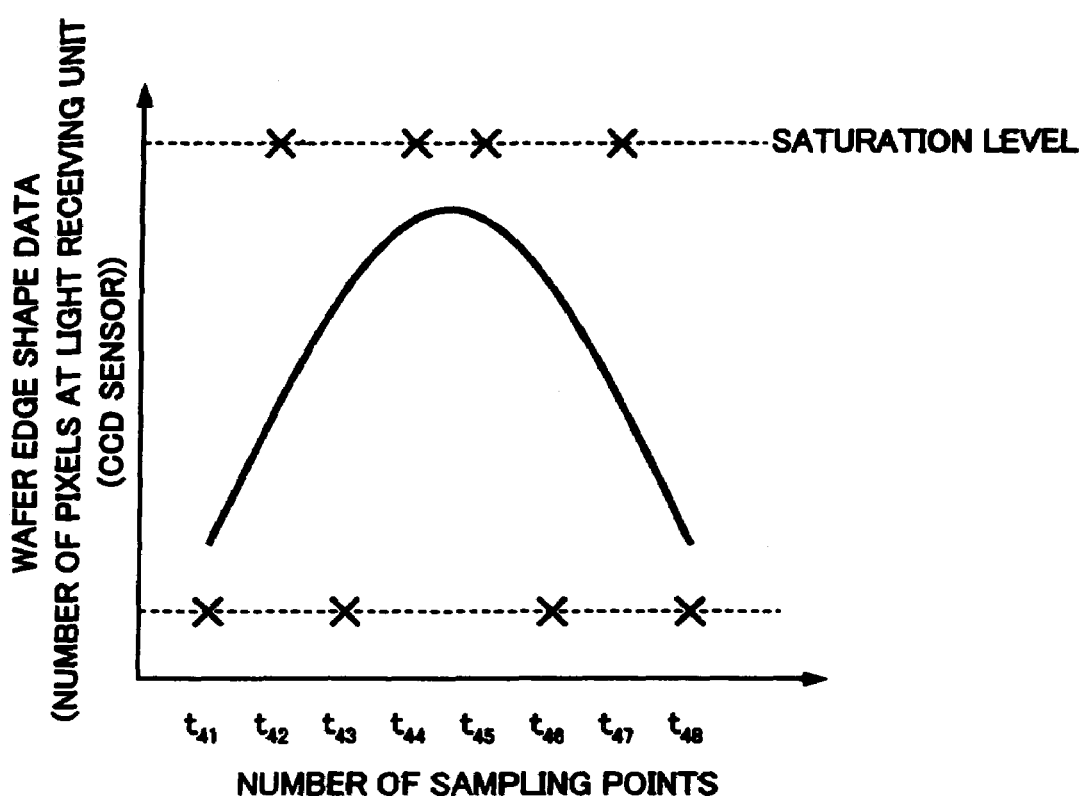
FIG. 26 shows the results obtained by executing only the second noise reduction processing on the sampling data in FIG. 25.

For instance, let us assume that the second judgment processing alone is executed on sampling data containing saturated data such as those shown in FIG. 25. When wafer edge shape data corresponding to a noise area contain a plurality of sets of saturated data manifesting discretely, as shown in the figure, an approximate curve (quadratic curvilinear expression) similar to the approximate curve for the actual notch mark may be obtained through quadratic curvilinear approximation by adopting the method of least squares, as shown in FIG. 26. In such a case, a significant error (offset) between the approximate curve and the sampling data for the notch mark cannot be recognized through the second judgment processing and, as a result, a noise area may be erroneously judged to be the notch mark provided that the coefficient $a_2$ for the quadratic term in the quadratic curvilinear expression is within the allowable range constituting the second judgment condition.

For this reason, it is desirable to execute the first judgment processing prior to the second judgment processing, particularly in conjunction with a transparent wafer W. By judging the extent of the error (offset) manifesting between the approximate curve and the sampling data for the notch mark in the first judgment processing, any randomness in the saturated data is not allowed to affect the notch mark judgment. Namely, since the error (offset) manifesting between the approximate curve corresponding to a noise area where saturated data manifest discretely, as shown in FIG. 26, and the sampling data for the notch mark is significant enough to exceed the allowable range, such a noise area is disqualified as a notch mark candidate through the first judgment processing. As a result, a notch mark candidate undergoes the subsequent second judgment processing only if the error (offset) manifesting between the corresponding approximate curve and the sampling data for the notch mark is within the allowable range. In other words, the notch mark judgment can be executed without being affected by any saturated data. As a result, a further improvement is achieved in the notch mark judgment accuracy.

It is to be noted that similar problems to those inherent to a transparent wafer W may also occur with regard to a nontransparent wafer W if abnormal data attributable to electrical noise or the like occurring in, for instance, the signal control manifest. For this reason, the first judgment processing may be executed prior to the second judgment processing in conjunction with a nontransparent wafer W as well. In short, the same judgment processing may be executed regardless of the wafer type, i.e., whether data are being sampled from a transparent wafer W or a nontransparent wafer W.

The second judgment processing described above is executed in step S357, and a decision is made in step S358 as to whether or not the second judgment condition is satisfied, i.e., whether or not the coefficient $a_2$ for the quadratic term in the curvilinear approximation expression for the notch mark, e.g., a quadratic curvilinear expression, is within the allowable range set as the second judgment condition.

If it is decided in step S358 that the coefficient does not satisfy the second judgment condition, the operation returns to step S351 to search for another notch mark candidate, whereas if the coefficient is judged to satisfy the second judgment condition, the operation returns to the processing in FIG. 17 to determine the notch mark candidate, having been judged to satisfy the judgment conditions in the notch mark judgment processing, to be the actual notch mark in step S360.

Then, the operation returns to the processing in FIG. 7 to calculate the position and the orientation of the notch mark in step S400. For instance, the position at which the sampling data corresponding to the notch mark candidate having been judged to be the actual notch mark in the notch mark judgment processing in FIG. 20 are present is designated as the actual position of the notch mark in the wafer edge shape data and the orientation of the notch mark is calculated.

Once the notch mark direction is calculated, the orientation of the wafer W is adjusted in step S500. For instance, based upon the position and the orientation of the notch mark ascertained through the processing executed in step S400, the wafer W is set to achieve a specific orientation by rotating the rotary stage 210. The sequence of the wafer positioning processing thus ends. Subsequently, the wafer W is taken out of the positioning device 200 by, for instance, the common transfer mechanism 160 which then carries it into a load-lock chamber or the like. Thus, the wafer W, having been positioned (aligned) to achieve a predetermined orientation, is carried into the processing chamber.

(Another Structural Example of Substrate Transfer Device)

Figure 27:
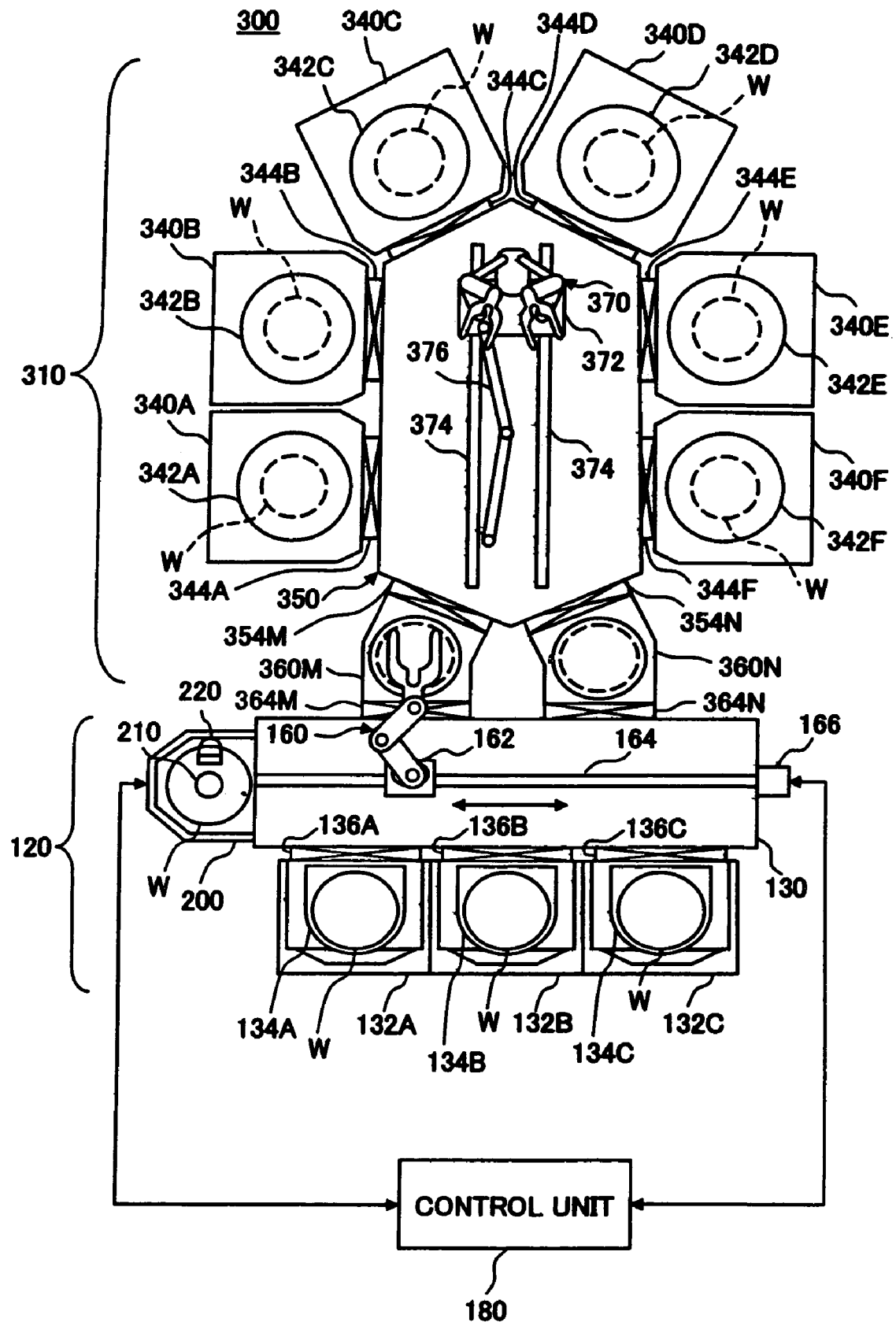
FIG. 27 is a sectional view presenting another structural example that may be adopted in the substrate processing apparatus in an embodiment on the present invention.

Next, another structural example that may be adopted in the substrate processing apparatus in an embodiment of the present invention is explained in reference to a drawing. The present invention may be adopted in various other substrate processing apparatuses as well as in the substrate processing apparatus 100 shown in FIG. 1. FIG. 27 schematically illustrates the structure of a substrate processing apparatus that includes a multichamber vacuum processing unit.

The substrate processing apparatus 300 in FIG. 27 includes a vacuum processing unit 310 with a plurality of processing chambers 340 where substrates such as wafers W undergo various types of processing such as film formation and etching and a transfer unit 120 that carries wafers W into/out of the vacuum processing unit 310. Since the transfer unit 120 adopts a structure substantially identical to that shown in FIG. 1, the same reference numerals are assigned to components thereof with substantially identical functions and structural features to preclude the necessity for a repeated explanation thereof.

A common transfer mechanism (atmospheric pressure-side transfer mechanism) 160 disposed inside the transfer chamber 130 at the transfer unit 120 in FIG. 7 adopts a single arm structure that includes a single end-effector. A base 162 at which the common transfer mechanism 160 is locked is slidably supported on a guide rail (not shown) extending over the central area inside the transfer chamber 130 along the lengthwise direction. A mover and a stator of a linear motor are respectively disposed at the base 162 and the guide rail. A linear motor drive mechanism (not shown) used to drive the linear motor is disposed at an end of the guide rail. The control unit 180 is connected to the linear motor drive mechanism. Thus, the linear motor drive mechanism is driven in response to a control signal provided by the control unit 180 to move the common transfer mechanism 160 along the direction indicated by the arrow together with the base 162 on the guide rail.

FIG. 27 shows the vacuum processing unit 310 which includes, for instance, six processing chambers 340A through 340F and is disposed at a side surface of the transfer unit 120. The vacuum processing unit 310 includes a common transfer chamber 350 through which wafers are carried into/out of the six processing chambers 340A through 340F, with the processing chambers 340A through 340F disposed around the common transfer chamber 350 respectively via gate valves 344A through 344F. In addition, first and second load-lock chambers 360M and 360N, which can be evacuated, are connected respectively via gate valves 354M and 354N with the common transfer chamber 350. The first and second load-lock chambers 360M and 360N are connected at a side surface of the transfer chamber 130 respectively via gate valves 364M and 364N.

As described above, the common transfer chamber 350 are connected with the six processing chambers 340A through 340F and with the load-lock chambers 360M and 360N so as to open/close the passages between them as necessary while sustaining a high level of airtightness in a cluster-tool structure. In other words, communication with the space inside the common transfer chamber 350 is achieved as necessary. In addition, the passages between the transfer chamber 130 and the first and second load-lock chambers 360M and 360N can be opened/closed as necessary while sustaining a required level of airtightness.

A single type of processing or different types of processing can be executed on the wafers W in the processing chambers 340A through 340F. Stages 342A through 342F on which the wafers W are to be placed are respectively disposed inside the processing chambers 340A through 340F.

The load-lock chambers 360M and 360N each have a function of temporarily holding a wafer W to be transferred to the next stage after a pressure adjustment. The load-lock chambers 360M and 360N may include a cooling mechanism or a heating mechanism.

Inside the common transfer chamber 350, a transfer mechanism (vacuum pressure-side transfer mechanism) 370 constituted with an articulated arm capable of extending/retracting, moving up/down and rotating, for instance, is disposed. The transfer mechanism 370 is rotatably supported at a base 372. The base 372 is allowed to slide freely over guide rails 374 extending from the base end side toward the front end side inside the common transfer chamber 350 via, for instance, an arm mechanism 376.

The load-lock chambers 360M and 360N and the processing chambers 340A through 340F can be accessed by the transfer mechanism 370 as it slides along the guide rails 374. For instance, to access the load-lock chamber 360M or 360N or either of the processing chambers 340A and 340F located at positions facing opposite each other, the transfer mechanism 370 is positioned on the guide rails 374 toward the base end of the common transfer chamber 350.

To access any of the four processing chambers 340B through 340E, the transfer mechanism 370 is positioned on the guide rails 374 toward the front end of the common transfer chamber 350. Thus, all the chambers connected to the common transfer chamber 350, i.e., the load-lock chambers 360M and 360N and the individual processing chambers 340A through 340F, can be accessed by the single transfer mechanism 370. The transfer mechanism 370 includes two end-effectors and thus is capable of handling two wafers W at a time.

It is to be noted that the transfer mechanism 370 may adopt a structure other than that described above, and may include, for instance, two transfer mechanisms. Namely, a first transfer mechanism constituted with an articulated arm capable of extending/retracting, moving up/down and rotating may be disposed toward the base end of the common transfer chamber 350 and a second transfer mechanism constituted with an articulated arm capable of extending/retracting, moving up/down and rotating may be disposed toward the front end of the common transfer chamber 350. In addition, the number of end-effectors at the transfer mechanism 370 does not need to be two, and the transfer mechanism 370 may include, for instance, a single end-effector, instead.

In the substrate processing apparatus 300 adopting the structure shown in FIG. 27, too, the positioning processing described earlier can be executed by engaging the positioning device 200 in operation. Thus, a noise area where abnormal data such as saturated data manifest is not erroneously judged to be the notch mark formed at the circumferential edge of the substrate and the notch mark judgment accuracy is improved in the substrate processing apparatus 300 as well.

It is to be noted that the number of processing chambers 340 in the substrate processing apparatus 300 does not need to be six, as shown in FIG. 27, and the substrate processing apparatus may include five or fewer processing chambers or it may include a greater number of processing chambers. In addition, while the substrate processing apparatus in FIG. 27 includes a single vacuum processing unit 310 constituted with a plurality of processing chambers connected around a single common transfer chamber 350, the present invention may be adopted in a substrate processing apparatus with a structure other than this. For instance, it may be adopted in a so-called tandem type substrate processing apparatus which includes two or more processing chamber units each made up with a plurality of processing chambers, connected around a single common transfer chamber 350 via buffer chambers.

The wafer positioning processing in the embodiment described above may be adopted in conjunction with a non-transparent wafer as well as a transparent wafer. For instance, abnormal data may be generated due to disturbance light or electrical noise when the detection target wafer is a nontransparent wafer, and in such a case, a noise area may be erroneously judged to be the notch mark formed at the wafer depending upon how the abnormal data are distributed. For this reason, by executing the wafer positioning processing in the embodiment in conjunction with a nontransparent wafer, erroneous notch mark judgment can be prevented to improve the notch mark judgment accuracy.

While an explanation is given above on an example in which a light-transmitting sensor is used to detect the shape at the wafer edge, the present invention is not limited to this example and a light-reflecting sensor may instead be utilized to detect the shape of the wafer edge. Since light is allowed to be transmitted through almost the entire area of a transparent wafer, there is a high likelihood of the light sensor generating saturated data (abnormal data) due to noise light such as disturbance light, regardless of whether the light sensor is a light-transmitting sensor or a light-reflecting sensor. Thus, there is a concern that depending upon how the saturated data are distributed, the noise area may be erroneously judged to be the notch mark at the wafer.

Accordingly, by executing the wafer positioning processing in the embodiments in conjunction with a light-reflecting sensor, such erroneous notch mark judgment can be prevented and the notch mark judgment accuracy can be improved.

In addition, the wafer positioning processing in the embodiment may be executed in conjunction with a wafer at which an orientation flat is formed to be used as a notch mark, instead of a wafer at which an actual notch is formed to be used as the notch mark.

Furthermore, it is obvious that the present invention may be achieved by providing a system or an apparatus with a medium such as a storage medium having stored therein a software program enabling the functions of the embodiment and by reading out and executing the program stored in the medium at the computer (or a CPU or MPU) of the system or the apparatus.

In such a case, the program itself read out from the medium such as a storage medium embodies the functions of the embodiment described above and the medium such as a storage medium having the program stored therein embodies the present invention. The medium such as a storage medium through which the program is provided may be, for instance, a floppy (registered trademark) disk, a hard disk, an optical disk, a magneto-optical disk, a CD-ROM, a CD-R, a CD-RW, a DVD-ROM, a DVD-RAM, a DVD-RW, a DVD+RW, magnetic tape, a nonvolatile memory card, or a ROM. Alternatively, such a program may be obtained through a download via a network.

It is to be noted that the scope of the present invention includes an application in which an OS or the like operating on the computer executes the actual processing in part or in whole in response to the instructions in the program read out by the computer and the functions of the embodiment are achieved through the processing thus executed, as well as an application in which the functions of the embodiment are achieved as the computer executes the program it has read out.

The scope of the present invention further includes an application in which the program read out from the medium such as a storage medium is first written into a memory in a function expansion board loaded in the computer or a function expansion unit connected to the computer, a CPU or the like in the function expansion board or the function expansion unit executes the actual processing in part or in whole in response to the instructions in the program and the functions of the embodiment described above are achieved through the processing.

While the invention has been particularly shown and described with respect to a preferred embodiment thereof by referring to the attached drawings, the present invention is not limited to this example and it will be understood by those skilled in the art that various changes in form and detail may be made therein without departing from the spirit, scope and teaching of the invention.

What is claimed is:

1. A substrate positioning device that detects a notch mark formed at a circumferential edge of a substrate and positions said substrate based upon said notch mark having been detected, comprising:

a rotary stage on which said substrate is placed;

a sensor unit that includes a light sensor capable of detecting the circumferential edge of said substrate placed on said rotary stage; and a control unit that obtains substrate edge shape data indicating detection values provided by said light sensor of said sensor unit and positions said substrate based upon said substrate edge shape data thus obtained, wherein:

said control unit executes noise reduction processing for detecting sudden abnormal data in said substrate edge shape data obtained from said sensor unit eliminating said sudden abnormal data thus detected and interpolating said substrate edge shape data by using estimated substrate edge shape data generated based upon data from a surrounding area in place of the eliminated abnormal data, notch mark judgment processing by detecting a notch mark candidate in said substrate edge shape data having undergone said noise reduction processing and making a decision as to whether or not an error manifesting between sets of data sampled over an area corresponding to said notch mark candidate having been detected and an approximate curve obtained by curvilinearly approximating the sets of data over the area corresponding to said notch mark candidate satisfies a specific judgment condition and substrate positioning processing for positioning said substrate based upon a notch mark satisfying said specific judgment condition, wherein:

said specific judgment condition upon which the decision is based in said notch mark judgment processing is that in reference to a height of said notch mark candidate area represented by said approximate curve, a ratio of the error to the height of said notch mark candidate area does not exceed a predetermined first judgment threshold value.

2. A substrate positioning device according to claim 1, wherein:

said predetermined first judgment threshold value is a value selected within a range of 1/40 to 7/10 of the height of said notch mark candidate area.

3. A substrate positioning device according to claim 2, wherein:

said predetermined first judgment threshold value is 1/10 of the height of said notch mark candidate area.

4. A substrate positioning device that detects a notch mark formed at a circumferential edge of a substrate and positions said substrate based upon said notch mark having been detected, comprising:

a rotary stage on which said substrate is placed;

a sensor unit that includes a light sensor capable of detecting the circumferential edge of said substrate placed on said rotary stage; and a control unit that obtains substrate edge shape data indicating detection values provided by said light sensor of said sensor unit and positions said substrate based upon said substrate edge shape data thus obtained, wherein:

said control unit executes noise reduction processing for detecting sudden abnormal data in said substrate edge shape data obtained from said sensor unit eliminating said sudden abnormal data thus detected and interpolating said substrate edge shape data by using estimated substrate edge shape data generated based upon data from a surrounding area in place of the eliminated abnormal data, notch mark judgment processing by detecting a notch mark candidate in said substrate edge shape data having undergone said noise reduction processing and making a decision as to whether or not an error manifesting between sets of data sampled over an area corresponding to said notch mark candidate having been detected and an approximate curve obtained by curvilinearly approximating the sets of data over the area corresponding to said notch mark candidate satisfies a specific judgment condition and substrate positioning processing for positioning said substrate based upon a notch mark satisfying said specific judgment condition, wherein:

in said notch mark judgment processing, superimposed substrate edge shape data are generated by offsetting and superimposing data corresponding to a half cycle in said substrate edge shape data having undergone said noise reduction processing and corresponding to one cycle of said substrate over the data corresponding to the other half cycle and a notch mark candidate is detected by using said superimposed data.

5. A substrate positioning method for detecting a notch mark formed at a circumferential edge of a substrate and positioning said substrate based upon said notch mark having been detected, comprising:

detecting the circumferential edge of said substrate with a light sensor and obtaining detection values provided by said light sensor as substrate edge shape data;

detecting sudden abnormal data in said substrate edge shape data, eliminating the detected sudden abnormal data and interpolating said substrate edge shape data with estimated substrate edge shape data obtained based upon data from a surrounding area in place of the eliminated abnormal data;

detecting a notch mark candidate in said substrate edge shape data having undergone said detecting sudden abnormal data in said substrate edge data, said eliminating the detected sudden abnormal data and said interpolating said substrate edge data and making a decision as to whether or not an error manifesting between sets of data sampled over an area corresponding to the notch mark candidate having been detected and an approximate curve obtained by curvilinearly approximating the sets of data over the area corresponding to the notch mark candidate satisfies a predetermined judgment condition; and positioning said substrate based upon a notch mark satisfying said predetermined judgment condition, wherein:

said predetermined judgment condition upon which the decision is based in said detecting a notch mark candidate is that in reference to a height of said notch mark candidate area represented by said approximate curve, a ratio of the error to the height of said notch mark candidate area does not exceed a predetermined first judgment threshold value.

6. A substrate positioning method according to claim 5, wherein:

said predetermined first judgment threshold value is a value selected within a range of 1/40 to 7/10 of the height of said notch mark candidate area.

7. A substrate positioning method according to claim 6, wherein:

said predetermined first judgment threshold value is 1/10 of the height of said notch mark candidate area.

8. A substrate positioning method for detecting a notch mark formed at a circumferential edge of a substrate and positioning said substrate based upon said notch mark having been detected, comprising:

detecting the circumferential edge of said substrate with a light sensor and obtaining detection values provided by said light sensor as substrate edge shape data;

detecting sudden abnormal data in said substrate edge shape data, eliminating the detected sudden abnormal data and interpolating said substrate edge shape data with estimated substrate edge shape data obtained based upon data from a surrounding area in place of the eliminated abnormal data;

detecting a notch mark candidate in said substrate edge shape data having undergone said detecting sudden abnormal data in said substrate edge shape data, said eliminating the detected sudden abnormal data and said interpolating said substrate edge shape data and making a decision as to whether or not an error manifesting between sets of data sampled over an area corresponding to the notch mark candidate having been detected and an approximate curve obtained by curvilinearly approximating the sets of data over the area corresponding to the notch mark candidate satisfies a predetermined judgment condition; and positioning said substrate based upon a notch mark satisfying said predetermined judgment condition, wherein:

in said detecting a notch mark candidate, superimposed substrate edge shape data are generated by offsetting and superimposing data corresponding to a half cycle in said substrate edge shape data having undergone said detecting sudden abnormal data in said substrate edge shape data, said eliminating the detected sudden abnormal data and said interpolating said substrate edge shape data and corresponding to one cycle of said substrate over the data corresponding to the other half cycle and a notch mark candidate is detected by using said superimposed data.

9. A computer readable storage medium storing a computer program, the computer readable storage medium being configured to execute the respective steps in claim 5.

10. A computer readable storage medium storing a computer program, the computer readable storage medium being configured to execute the respective steps in claim 8.

* * * * *